United States Patent
Ju et al.

(10) Patent No.: US 11,081,680 B2
(45) Date of Patent: Aug. 3, 2021

(54) PIXEL STRUCTURE, METHOD FOR FORMING THE SAME, AND DISPLAY SCREEN

(71) Applicant: SEEYA OPTRONICS CO., LTD., Shanghai (CN)

(72) Inventors: Yuhan Ju, Shanghai (CN); Tieer Gu, Shanghai (CN); Jie Kong, Shanghai (CN)

(73) Assignee: SEEYA OPTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/729,814

(22) Filed: Dec. 30, 2019

(65) Prior Publication Data
US 2020/0136095 A1    Apr. 30, 2020

Related U.S. Application Data

(63) Continuation of application No. PCT/CN2018/084056, filed on Apr. 23, 2018.

(30) Foreign Application Priority Data

Aug. 8, 2017 (CN) .......................... 201710669365.7

(51) Int. Cl.
*H01L 27/32* (2006.01)
*H01L 51/52* (2006.01)
(Continued)

(52) U.S. Cl.
CPC ............ *H01L 51/56* (2013.01); *H01L 27/322* (2013.01); *H01L 27/326* (2013.01);
(Continued)

(58) Field of Classification Search
CPC ............ H01L 51/5265; H01L 27/3211; H01L 51/5218; H01L 51/5064; H01L 51/5234; H01L 51/5262; H01L 27/3246
See application file for complete search history.

(56) References Cited

U.S. PATENT DOCUMENTS

| | | | |
|---|---|---|---|
| 2009/0200544 A1* | 8/2009 | Lee | H01L 51/5265 257/40 |
| 2011/0062475 A1* | 3/2011 | Oho | H01L 51/5265 257/98 |

(Continued)

FOREIGN PATENT DOCUMENTS

| | | |
|---|---|---|
| CN | 104409468 A | 3/2015 |
| CN | 105720081 A | 6/2016 |

(Continued)

*Primary Examiner* — Bradley Smith
*Assistant Examiner* — David J Goodwin
(74) *Attorney, Agent, or Firm* — Carlson, Gaskey & Olds

(57) ABSTRACT

A pixel structure, a method for forming the pixel structure, and a display screen are provided. The method includes: providing a substrate for forming an OLED device, the substrate having a first pixel area, a second pixel area, and a third pixel area; and forming a compensation layer on the substrate, the compensation layer having different thicknesses in the first pixel area, the second pixel area, and the third pixel area. In the present disclosure, the compensation layer is formed on the substrate, and the compensation layer has different thicknesses respectively in the first pixel area, the second pixel area and the third pixel area, so that the cavity of the first pixel area, the cavity of the second pixel area, and the cavity of the third pixel area can be individually controlled.

18 Claims, 12 Drawing Sheets

(51) Int. Cl.
*H01L 51/56* (2006.01)
*H01L 51/00* (2006.01)
*H01L 51/50* (2006.01)

(52) U.S. Cl.
CPC ...... *H01L 27/3276* (2013.01); *H01L 51/0096* (2013.01); *H01L 51/5036* (2013.01); *H01L 51/5209* (2013.01); *H01L 51/5218* (2013.01)

(56) References Cited

U.S. PATENT DOCUMENTS

| | | | | |
|---|---|---|---|---|
| 2011/0241000 | A1* | 10/2011 | Choi | H01L 51/5218 257/59 |
| 2014/0191202 | A1* | 7/2014 | Shim | H01L 51/5265 257/40 |
| 2018/0061896 | A1* | 3/2018 | Cheng | H01L 51/5218 |

FOREIGN PATENT DOCUMENTS

| | | |
|---|---|---|
| CN | 106463634 A | 2/2017 |
| CN | 106981504 A | 7/2017 |

\* cited by examiner

PIXEL STRUCTURE, METHOD FOR FORMING THE SAME, AND DISPLAY SCREEN

CROSS REFERENCE TO RELATED APPLICATION

This application is a continuation of International Application No. PCT/CN2018/084056, dated Apr. 23, 2018, which claims priority to CN Application No. 201710669365.7, dated Aug. 8, 2017.

TECHNICAL FIELD

The present disclosure relates to the field of display technologies, and in particular, to a pixel structure, a method for forming the same, and a display screen.

BACKGROUND

With development of multimedia technologies, requirements on performances of flat panel display devices are getting higher and higher. At present, a plasma display device, a field emission display device and an organic electroluminescence display device are main display technologies. The organic electroluminescence display device is a display device manufactured based on an Organic Light Emitting Diode (OLED), and has advantages such as high reaction speed, high contrast, a wide viewing angle and the like. In addition, the OLED panel has a characteristic of self-illumination without backlight, thereby saving a cost of a backlight module. Moreover, the OLED panel is lighter and thinner than a conventional liquid crystal display panel, so that the OLED has a great application prospect in the field of display and the like.

An OLED on Silicon is a display screen technology that adopts a silicon wafer as a driving circuit substrate and forms an OLED on the silicon wafer as a light-emitting unit. The OLED on Silicon uses a manufacturing process of an integrated circuit to produce a pixel having a minimum size of 3 μm to 4 μm. Since a shadow mask required for manufacturing the OLED pixel structure is difficult to achieve such high precision, a white light OLED layer only needs to block a peripheral circuit of each screen during evaporation process and the shadow mask does not need to be provided with an opening for a single pixel but is provided with an opening for an entire display area, the OLED on Silicon that is actually produced at present achieves color display mainly by a white light OLED layer and a color filter.

However, the pixel structure of OLED on Silicon in the related art has a low brightness.

SUMMARY

The problem to be solved by the present disclosure is to provide a pixel structure, a method for forming the pixel structure, and a display screen, which can improve brightness of a pixel structure of OLED on Silicon, thereby improving the brightness and color gamut of the display screen.

In order to solve the problem described above, the present disclosure provides a method for forming a pixel structure, and the method includes steps of: providing a substrate for forming an OLED device, wherein the substrate has a first pixel area, a second pixel area, and a third pixel area; forming an anode layer on the substrate; forming a first compensation material layer, a second compensation material layer, and a third compensation material layer on a part of the anode layer in the first pixel area; forming the first compensation material layer and the second compensation material layer on a part of the anode layer in the second pixel area; and forming the first compensation material layer on a part of the anode layer in the third pixel area.

The first compensation material layer, the second compensation material layer, and the third compensation material layer in the first pixel area constitute a part of a compensation layer in the first pixel area; the first compensation material layer and the second compensation material layer in the second pixel area constitute a part of the compensation layer in the second pixel area; and the first compensation material layer in the third pixel area constitutes a part of the compensation layer in the third pixel area.

The present disclosure further provides a pixel structure, including: a substrate for forming an OLED device, the substrate having a first pixel area, a second pixel area, and a third pixel area, and the first pixel area is a red light pixel area, the second pixel area is a green light pixel area, and the third pixel area is a blue light pixel area; an anode layer located on the substrate; and a compensation layer located on the anode layer, the compensation layer including: a first compensation material layer located on the substrate in the first pixel area, the second pixel area, and the third pixel area; a second compensation material layer located on the first compensation material layer in the first pixel area and the second pixel area; and a third compensation material layer located on the second compensation material layer in the first pixel area. The first compensation material layer, the second compensation material layer, and the third compensation material layer in the first pixel area constitute a part of the compensation layer in the first pixel area; the first compensation material layer and the second compensation material layer in the second pixel area constitute a part of the compensation layer in the second pixel area; the first compensation material layer in the third pixel area constitutes a part of the compensation layer in the third pixel area.

For a pixel structure of a high-resolution (1000PPI to 3000PPI) OLED on Silicon, due to limitation of an opening size of a shadow mask, it is difficult to use the shadow mask to evaporate a compensation layer having different thicknesses for pixel areas having different colors. As a result, the first pixel area I, the second pixel area II, and the third pixel area III can only be evaporated at the same time. Therefore, in the present disclosure, the compensation layer can have different thicknesses respectively in the first pixel area I, the second pixel area II, and the third pixel area III by means of alternating evaporation and etching processes of the compensation material layer. In this way, the thickness of the compensation layer in different pixel areas can be precisely controlled.

DESCRIPTION OF EMBODIMENTS

It is known from the background that the pixel structure of OLED on Silicon has a low brightness. A reason for the low brightness will be explained as follows.

Due to limitation of a shadow mask manufacturing process and alignment precision of the shadow mask and a substrate during evaporation, for a OLED on Silicon pixel structure with high resolution (1000PPI to 3000PPI), a white OLED layer can be evaporated only by an Open Mask manner, and then cooperates with a color filter (such as a RGB filter) to achieve full-color display.

Therefore, for a red light pixel area, a green light pixel area, and a blue light pixel area, the actual light-emitting OLED devices are the same. Correspondingly, OLED devices corresponding to the red light pixel area, the green light pixel area, and the blue light pixel area have a same cavity length (i.e., a distance between an anode and a cathode of the OLED device).

However, white light emitted from the OLED device loses more than half of brightness after passing the color filter, and the OLED devices corresponding to the red light pixel area, the green light pixel area, and the blue light pixel area have a same cavity length when manufacturing the white light OLED device, therefore, it is impossible to achieve a strong micro cavity effect to improve a light-emitting efficiency and a color purity. As a result, the display screen has a low brightness, which is usually only about 300 nit.

In order to solve the described technical problem, in the present disclosure, compensation layers having different thicknesses are formed in a first pixel area, a second pixel area, and a third pixel area, so that cavity lengths of the first pixel area, the second pixel area, and the third pixel area can be individually modulated. Therefore, the OLED device can use the strong micro cavity effect to improve the light-emitting efficiency and improve the color purity, thereby improving the brightness and the color gamut of the display screen.

In order to better illustrate the purposes, features and advantages of the present disclosure described above, specific embodiments of the present disclosure will be described in details with reference to the accompanying drawings in the following.

FIG. 1 to FIG. 13 are schematic diagrams illustrating structures corresponding to respective steps of a method for forming a pixel structure according to a first embodiment of the present disclosure.

Figure 1:
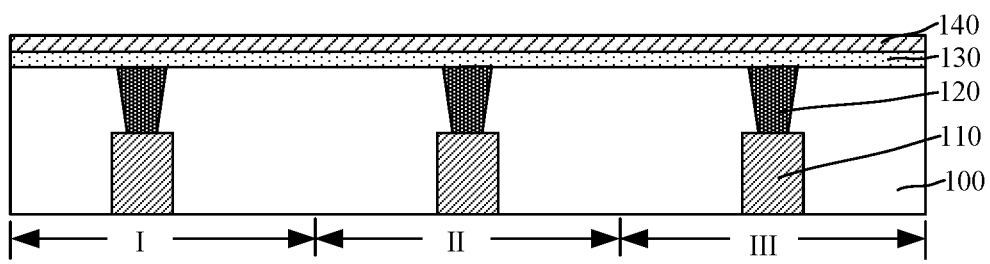
FIG. 1 to FIG. 13 are schematic diagrams illustrating structures corresponding to respective steps of a method for forming a pixel structure according to a first embodiment of the present disclosure.

With reference to FIG. 1, a substrate 100 is provided for forming an OLED device, and the substrate 100 has a first pixel area I, a second pixel area II, and a third pixel area III.

The substrate provides a driving circuit substrate for subsequent formation of the OLED device.

For example, the OLED device can be a top-emitting OLED device.

In this embodiment, the formed pixel structure is an OLED on Silicon structure. The OLED on Silicon refers to a display screen technology that adopts a silicon wafer as a driving circuit substrate and forms an OLED on the silicon wafer as a light-emitting unit.

An interconnection metal layer 110 and a conductive plug 120 electrically connected to the interconnection metal layer 110 are formed in the substrate 100, and the substrate 100 exposes the conductive plug 120, thereby achieving circuit connection of the substrate 100 with the subsequently formed OLED device.

The first pixel area I, the second pixel area II, and the third pixel area III are configured to emit light of different colors. In this embodiment, the formed pixel structure achieves color display by a white light OLED layer together with a color filter, and the color filter is an RGB filter. In this case, the first pixel area I is a red light pixel area, the second pixel area II is a green light pixel area, and the third pixel area III is a blue light pixel area.

With further reference to FIG. 1, it should be noted that, after the substrate 100 is provided, the method further includes a step of forming an anode layer 130 on the substrate 100.

In an OLED device, the anode layer 130 and a cathode layer (not shown) on the substrate 100, and a plurality of organic function layers (not shown) between the anode layer 130 and the cathode layer are usually included. The anode layer 130 is connected to a positive electrode of an electric power to form an anode, and the cathode layer is connected to a negative electrode of the electric power to form a cathode. When an appropriate voltage is applied to the anode layer 130 and the cathode layer, holes generated by the anode and charges generated by the cathode are combined to form light.

The anode layer 130 can be formed as a single-layer structure or a stacked-layer structure. Specifically, the anode layer 130 can be a reflective metal layer, or the anode layer 130 includes a reflective metal layer and a transparent conductive layer located on the reflective metal layer.

The reflective metal layer has good reflectivity and ductility, and thus can play a role of reflection and conduction. The transparent conductive layer has advantages such as good conductivity, high transparency, high work function and the like, thereby facilitating improving display efficiency. The reflective metal layer may be made of a metal such as Al, Ag or Cu, and the transparent conductive layer may be made of one or more of ITO, IZO, MoOx and AZO.

In this embodiment, the anode layer 130 is a reflective metal layer.

Since the Al material has high reflectivity, and an etching process for the Al material is relatively simple, the reflective metal layer is made of Al in this embodiment when taking an overall consideration of a process difficulty and a metal reflectivity.

In this embodiment, the anode layer 130 is formed on the substrate 100 by evaporation process. Specifically, the evaporation process is a physical vapor deposition process.

It should be noted that, in this embodiment, the anode layer 130 has a same thickness respectively in the first pixel area I, the second pixel area II, and the third pixel area III.

With further reference to FIG. 1 and in conjunction with FIG. 2 to FIG. 11, a compensation layer (not labeled) is formed on the substrate 100, and the compensation layer has different thicknesses respectively in the first pixel area I, the second pixel area II, and the third pixel area III.

In the OLED device, since the anode layer 130 and the cathode layer (not shown) have reflective characteristics, light is reciprocally reflected between the anode layer 130 and the cathode layer, thereby forming a micro cavity effect. The compensation layer has different thicknesses respectively in the first pixel area I, the second pixel area II, and the third pixel area III, so that cavity lengths of the first pixel area I, the second pixel area II and the third pixel area III can be respectively modulated by the compensation layer in the first pixel area I, the second pixel area II and the third pixel area III. The OLED device can use a strong micro cavity effect to improve the light-emitting efficiency and color purity of the formed pixel structure, thereby improving the brightness and color gamut of the display screen.

Therefore, in this embodiment, the compensation layer is made of a highly transparent metal oxide. Specifically, the compensation layer is made of one or more of ITO, IZO, MoOx and AZO.

The first pixel area I is a red light pixel area, the second pixel area II is a green light pixel area, and the third pixel area III is a blue light pixel area. Since a wavelength of green light is smaller than a wavelength of red light and larger than a wavelength of blue light, in order to allow the subsequently formed OLED device to use a strong micro cavity effect, a cavity length of the second pixel area II is smaller than a cavity length of the first pixel area I and larger than a cavity length of the third pixel area III; and correspondingly, the thickness of the compensation layer in the second pixel area II is smaller than the thickness of the compensation layer in the first pixel area I and larger than the thickness of the compensation layer in the third pixel area III.

For a pixel structure of a high-resolution (1000PPI to 3000PPI) OLED on Silicon, due to limitation of an opening size of a shadow mask, it is difficult to use the shadow mask to respectively evaporate the compensations layer having different thicknesses for pixel areas of different colors. As a result, the first pixel area I, the second pixel area II, and the third pixel area III can only be evaporated at the same time. Therefore, in this embodiment, evaporation process and etching process of the compensation material layer can be alternately performed in such a manner that the compensation layer can have different thicknesses respectively in the first pixel area I, the second pixel area II, and the third pixel area III.

Steps of forming the compensation layer will be described in details in the following with reference to the accompanying drawings.

With further reference to FIG. 1, a first compensation material layer 140 is formed on the anode layer 130.

The first compensation material layer 140 is a part of a subsequently formed compensation layer.

Therefore, the first compensation material layer 140 may be made of one or more of ITO, IZO, MoOx, and AZO.

In this embodiment, the first compensation material layer 140 is formed on the anode layer 130 by an evaporation process. Specifically, the evaporation process is a physical vapor deposition process.

It should be noted that only the first compensation material layer 140 is subsequently formed on the anode layer 130 in the third pixel area III, that is, the compensation layer in the third pixel area III is a single layer, and thus a thickness of the first compensation material layer 140 needs to meet requirements of blue light pixels. The first compensation material layer 140 is configured to modulate the cavity length of the third pixel area III.

To this end, in this embodiment, the first compensation material layer 140 has a thickness within a range of 100 Å to 500 Å.

It should further be noted that the anode layer 130 is prone to be oxidized when being exposed to air, causing an increase in a resistance of the anode layer 130 and thus causing a decrease in the performance of the formed pixel structure. To this end, in this embodiment, the first compensation material layer 140 is formed in a machine, in which the anode layer 130 is formed, while keeping vacuum. That is, continuous deposition of the anode layer 130 and the first compensation material layer 140 is ensured, so as to prevent the anode layer 130 from contacting air.

Figure 2:
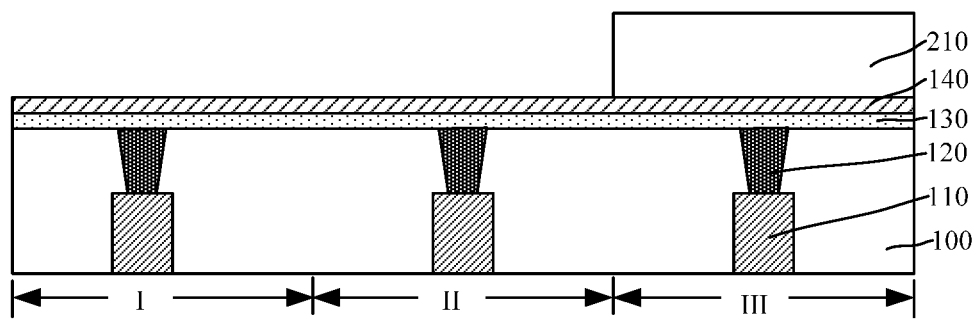
Figure 3:
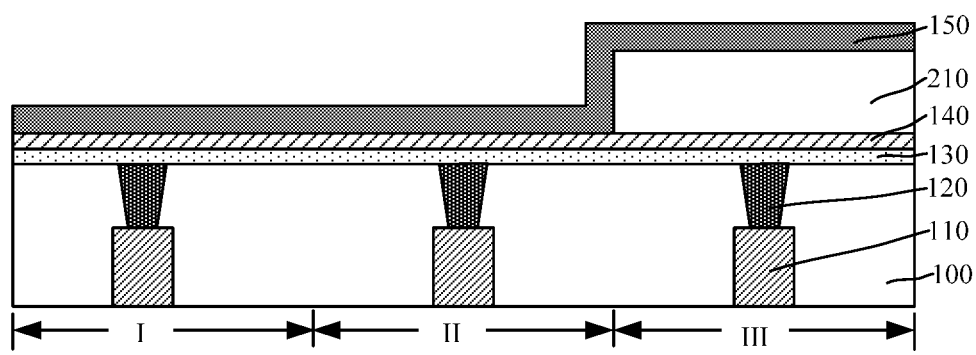

With reference to FIG. 2 and FIG. 3, a second compensation material layer 150 (shown in FIG. 3) is formed on the first compensation material layer 140.

The second compensation material layer 150 is a part of a subsequently formed compensation layer.

Therefore, the second compensation material layer 150 may be made of one or more of ITO, IZO, MoOx, and AZO.

In this embodiment, in order to reduce difficulty of a subsequent process while improving process compatibility, the second compensation material layer 150 and the 140 are made of a same material.

In this embodiment, a second compensation material layer 150 is formed on the first compensation material layer 140 by an evaporation process. Specifically, the evaporation process is a physical vapor deposition process.

It should be noted that only the first compensation material layer 140 and the second compensation material layer 150 are subsequently formed on the anode layer 130 in the second pixel area II, that is, the compensation layer in the second pixel area II includes both the first compensation material layer 140 and the second compensation material layer 150, and thus a total thickness of the first compensation material layer 140 and the second compensation material layer 150 needs to meet requirements of green light pixels. The first compensation material layer 140 and the second compensation material layer 150 are configured to modulate the cavity length of the second pixel area II.

Therefore, under a premise that the thickness of the first compensation material layer 140 meets requirements of red light pixels, the thickness of the second compensation material layer 150 should be reasonably set. In this embodiment, the thickness of the second compensation material layer 150 is within a range of 300 Å to 700 Å.

Only the first compensation material layer 140 is subsequently formed on the anode layer 130 in the third pixel area III. Correspondingly, subsequent steps further includes removing the second compensation material layer 150 in the third pixel area III. In order to reduce an adverse influence of a process of removing the second compensation material layer 150 in the third pixel area III on the first compensation material layer 140 in the third pixel area III, forming the second compensation material layer 150 includes: forming a first sacrifice layer 210 (shown in FIG. 2) on the first compensation material layer 140 in the third pixel area III; and forming a second compensation material layer 150 in such a manner that the second compensation material layer 150 covers the first compensation material layer 140 in the first pixel area I and in the second pixel area II and the first sacrifice layer 210.

The first sacrifice layer 210 is configured to protect the first compensation material layer 140 in the third pixel area III during a process of subsequently removing the second compensation material layer 150 in the third pixel area III.

After the second compensation material layer 150 of the third pixel area III is removed, the first sacrifice layer 210 is also removed. Thus, the first sacrifice layer 210 can be made of a material that is prone to be removed, and a process of removing the first sacrifice layer 210 has a small influence on the first compensation material layer 140 and the second compensation material layer 150.

Therefore, in this embodiment, under a premise of ensuring a protection function of the first sacrifice layer 210, an influence of the first sacrifice layer 210 on the subsequently formed pixel structure is reduced. The first sacrifice layer 210 is made of a photoresist, and the first sacrifice layer 210 is formed by an exposure development process.

It should be noted that in this embodiment, after the first sacrifice layer 210 is formed, the first sacrifice layer 210 further exposes the first compensation material layer 140 at a junction of the third pixel area III and the second pixel area II, thereby providing a process basis for subsequently forming a first isolation opening exposing the substrate 100 at the junction of the third pixel area III and the second pixel area II.

Figure 4:
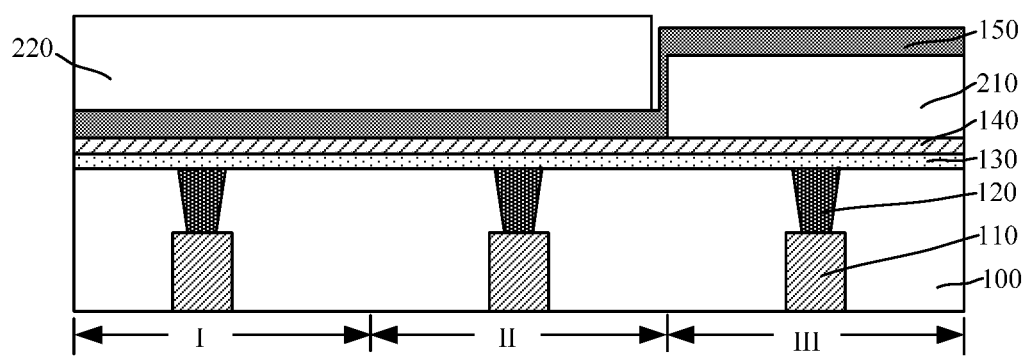
Figure 5:
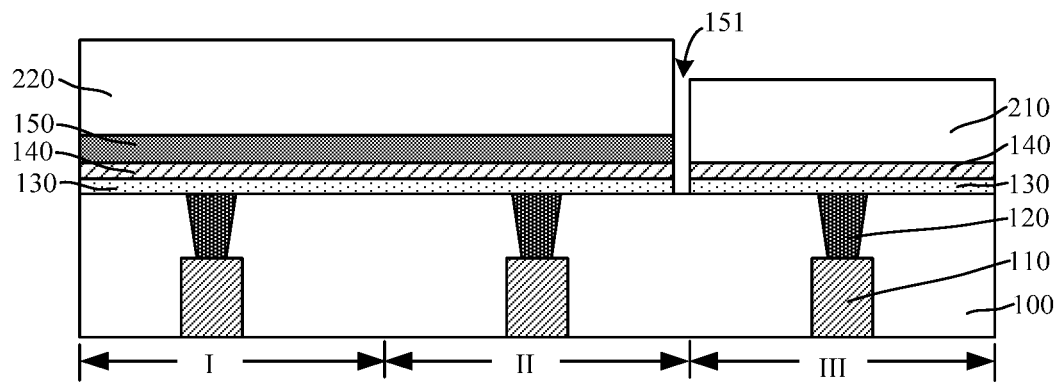
Figure 6:
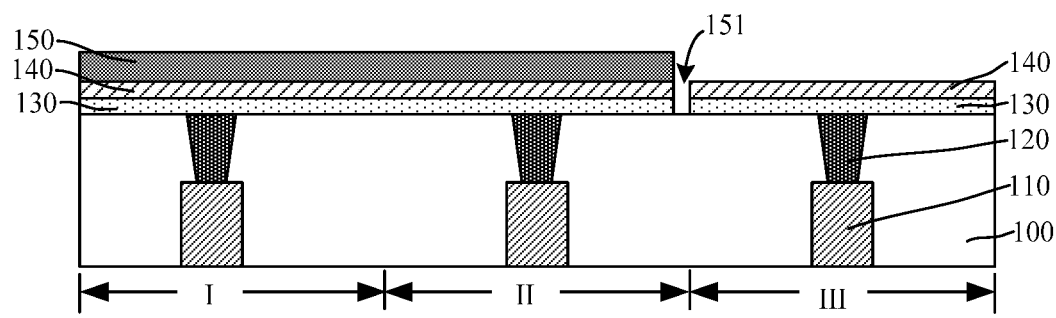

With reference to FIG. 4 to FIG. 6, the second compensation material layer 150 in the third pixel area III is removed.

The thickness of the compensation layer in the third pixel area III is reduced by removing the second compensation material layer 150 in the third pixel area III.

Specifically, removing the second compensation material layer 150 in the third pixel area III includes: forming a first photoresist layer 220 on the second compensation material layer 150 in the first pixel area I and the second pixel area II (as shown in FIG. 4); etching and removing the second compensation material layer 150 in the third pixel area III by using the first photoresist layer 220 as a mask; and removing the first photoresist layer 220.

In this embodiment, during the etching process, the second compensation material layer 150 on a sidewall and a top of the first sacrifice layer 210 is removed by etching.

It should be noted that after the first photoresist layer 220 is formed, the first photoresist layer 220 further exposes the second compensation material layer 150 at the junction of the second pixel area II and the third pixel area III. Therefore, in the step of removing the second compensation material layer 150 in the third pixel area III, the second compensation material layer 150, the first compensation material layer 140, and the anode layer 130 at the junction of the second pixel area II and the third pixel area III are also etched and removed. A first isolation opening 151 exposing the substrate 100 is formed at the junction of the second pixel area II and the third pixel area III (as shown in FIG. 5).

The first isolation opening 151 provides a space for subsequently forming an isolation layer for isolating the second pixel area II from the third pixel area III.

In this embodiment, in order to better control a topography of the remaining second compensation material layer 150, first compensation material layer 140, and anode layer 130, etching is performed by a dry etching process.

In other embodiments, the etching may be performed by a wet etching process, or an etching process combining a dry etching process and a wet etching process.

It should be noted that the first sacrifice layer 210 is formed on the first compensation material layer 140 in the third pixel area III, and after the second compensation material layer 150 in the third pixel area III is removed, the first sacrifice layer 210 is exposed, and the first sacrifice layer 210 is made of a photoresist. Therefore, as shown in FIG. 6, in the step of removing the first photoresist layer 220, the first sacrifice layer 210 is also removed, and correspondingly, an additional process of removing the first sacrifice layer 210 then can be avoided.

Specifically, the first photoresist layer 220 and the first sacrifice layer 210 are removed by an ashing or a wet degumming process.

Figure 7:
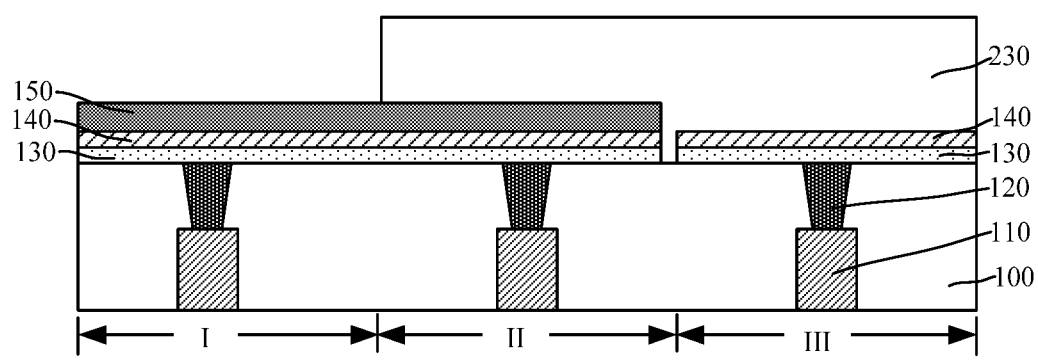
Figure 8:
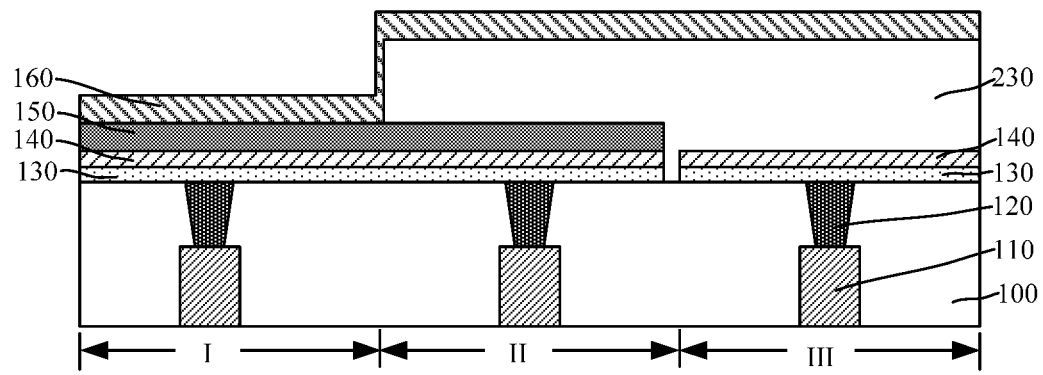

With reference to FIG. 7 and FIG. 8, after the second compensation material layer 150 in the third pixel area III is removed, a third compensation material layer 160 is formed on the second compensation material layer 150 in the first pixel area I and the second pixel area II and on the first compensation material layer 140 in the third pixel area III (as shown in FIG. 8).

The third compensation material layer 160 is a part of a subsequently formed compensation layer.

Therefore, the third compensation material layer 160 may be made of one or more of ITO, IZO, MoOx, and AZO.

In this embodiment, in order to reduce difficulty of a subsequent process while improving process compatibility, the third compensation material layer 160 and the first compensation material layer 140 are made of a same material.

In this embodiment, the third compensation material layer 160 is formed by an evaporation process. Specifically, the evaporation process is a physical vapor deposition process.

It should be noted that the third compensation material layer 160 is subsequently formed only on the second compensation material layer 150 in the first pixel area I, and thus a total thickness of the first compensation material layer 140, the second compensation material layer 150, and the third compensation material layer 160 needs to meet requirements of red light pixels. The first compensation material layer 140, the second compensation material layer 150, and the third compensation material layer 160 in the first pixel area I are configured to modulate a cavity length of the first pixel area I.

Therefore, under a premise that the thickness of the first compensation material layer 140 meets requirements of red light pixels and the thickness of the second compensation material layer 150 meets requirements of green light pixels, the thickness of the third compensation material layer 160 should be reasonably set. In this embodiment, the thickness of the third compensation material layer 160 is within a range of 300 Å to 700 Å.

The third compensation material layer 160 is subsequently formed only on the second compensation material layer 150 in the first pixel area I. Correspondingly, subsequent steps further include: removing the third compensation material layer 160 in the second pixel area II and the third pixel area III. In order to reduce an adverse influence of a process of removing the third compensation material layer 160 in the second pixel area II and the third pixel area III on the second compensation material layer 150 in the second pixel area II and the first compensation material layer 140 in the third pixel area III, forming the third compensation material layer 160 includes: forming a second sacrifice layer 230 on the second compensation material layer 150 in the second pixel area II and on the first compensation material layer 140 in the third pixel area III (as shown in FIG. 7); and forming the third compensation material layer 160 in such a manner that the third compensation material layer 160 covers the first compensation material layer 150 in the first pixel area I and the second sacrifice layer 230.

The second sacrifice layer 230 is configured to protect the second compensation material layer 150 in the second pixel area II and the first compensation material layer 140 in the third pixel area III during a process of subsequently removing the third compensation material layer 160 in the second pixel area II and the third pixel area III.

After the third compensation material layer 160 in the second pixel area II and the third pixel area III is removed, the second sacrifice layer 230 is also removed. Thus, the second sacrifice layer 230 is made of a material that is prone to be removed, and a process of removing the second sacrifice layer 230 has a small influence on the first compensation material layer 140, the second compensation material layer 150, and the third compensation material layer 160.

Therefore, in this embodiment, under a premise of ensuring the protection function of the second sacrifice layer 230, an influence of the second sacrifice layer 230 on the formed pixel structure is reduced. The second sacrifice layer 230 is made of a photoresist, and the second sacrifice layer 230 is formed by an exposure development process.

It should be noted that in this embodiment, after the second sacrifice layer 230 is formed, the second sacrifice layer 230 also exposes the second compensation material layer 150 at a junction of the second pixel area II and the first pixel area I, thereby providing a process basis for subsequently forming a second isolation opening exposing the substrate 600 at the junction of the second pixel area II and the first pixel area I.

Figure 9:
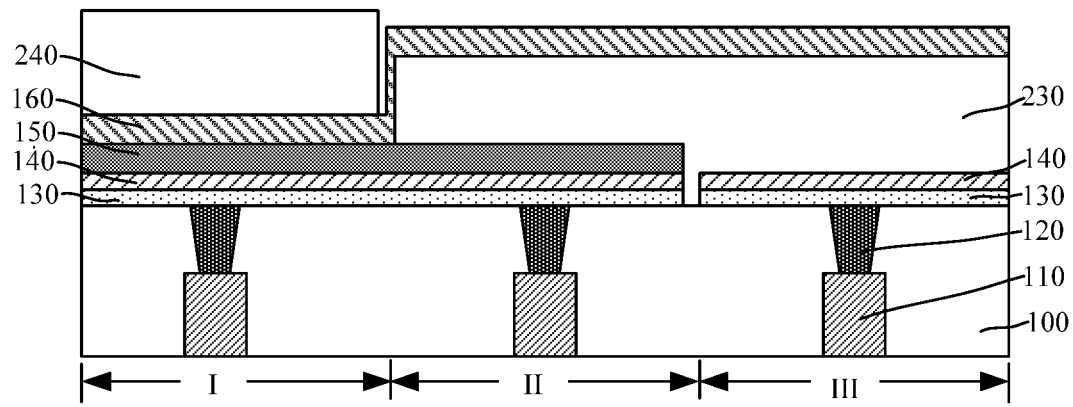
Figure 10:
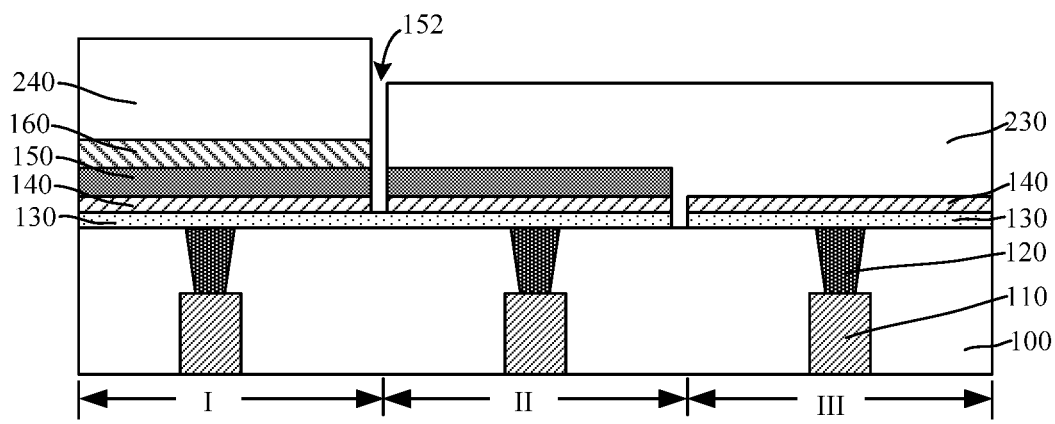
Figure 11:
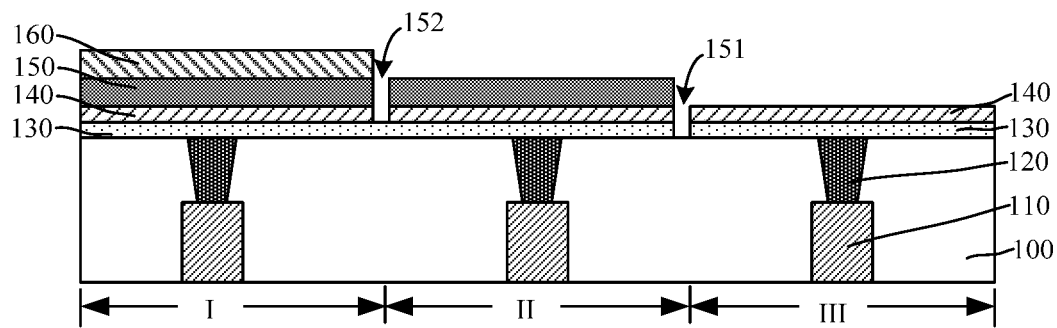

With reference to FIG. 9 to FIG. 11, the third compensation material layer 160 in the second pixel area II and the third pixel area III is removed.

The thickness of the compensation layer in the second pixel area II and the third pixel area III is reduced by removing the third compensation material layer 160 in the second pixel area II and the third pixel area III, and the thickness of the compensation layer in the second pixel area II is larger than the thickness of the compensation layer in the third pixel area III.

Specifically, removing the third compensation material layer 160 in the second pixel area II and the third pixel area III includes: forming a second photoresist layer 240 on the third compensation material layer 160 in the first pixel area I (as shown in FIG. 9); etching and removing the third compensation material layer 160 in the second pixel area II and the third pixel area III by using the second photoresist layer 240 as a mask; and removing the second photoresist layer 240.

In this embodiment, during the etching process, the third compensation material layer 160 on a sidewall and a top of the second sacrifice layer 230 is etched and removed.

It should be noted that the second photoresist layer 240 also exposes the third compensation material layer 160 at the junction of the first pixel area I and the second pixel area II. Thus, in the step of removing the third compensation material layer 160 in the second pixel area II and the third pixel area III, the third compensation material layer 160, the second compensation material layer 150, the first compensation material layer 140, and the anode layer 130 at the junction of the first pixel area I and the second pixel area II are also etched and removed, and a second isolation opening 152 exposing the substrate 100 at the junction of the first pixel area I and the second pixel area II is formed (as shown in FIG. 10).

The second isolation opening 152 provides a space for subsequently forming an isolation layer for isolating the first pixel area I from the second pixel area II.

In this embodiment, in order to better control a topography of the remaining third compensation material layer 160, second compensation material layer 150, first compensation material layer 140, and anode layer 130, etching is performed by a dry etching process.

In other embodiments, the etching may be performed by a wet etching process, or an etching process combining a dry etching process and a wet etching process.

It should be noted that the second sacrifice layer 230 is formed on the second compensation material layer 150 in the second pixel area II and on the first compensation material layer 140 in the third pixel area III. After the third compensation material layer 160 in the second pixel area II and the third pixel area III is removed, the second sacrifice layer 230 is exposed, and the second sacrifice layer 230 is made of a photoresist. Therefore, as shown in FIG. 11, in the step of removing the second photoresist layer 240, the second sacrifice layer 230 is also removed, and correspondingly an additional process of removing the second sacrifice layer 230 then can be avoided.

Specifically, the second photoresist layer 240 and the second sacrifice layer 230 are removed by an ashing or a wet degumming process.

Therefore, in this embodiment, the first compensation material layer 140, the second compensation material layer 150, and the third compensation material layer 160 in the first pixel area I constitute the compensation layer in the first pixel area I. The first compensation material layer 140 and the second compensation material layer 150 in the second pixel area II constitute the compensation layer in the second pixel area II. The first compensation material layer 140 in the third pixel area III constitutes the compensation layer in the third pixel area III. The compensation layer in the first pixel area I, the compensation layer in the second pixel area II, and the compensation layer in the third pixel area III are separated from one another.

Correspondingly, a bottom of the compensation layer in the first pixel area I, a bottom of the compensation layer in the second pixel area II, and a bottom of the compensation layer in the third pixel area III are flush, while there are height differences among a top of the compensation layer in the first pixel area I, a top of the compensation layer in the second pixel area II, and a top of the compensation layer in the third pixel area III. In this way, the cavity length of the first pixel area I, the cavity of the second pixel area II, and the cavity of the third pixel area III can be individually modulated.

Figure 12:
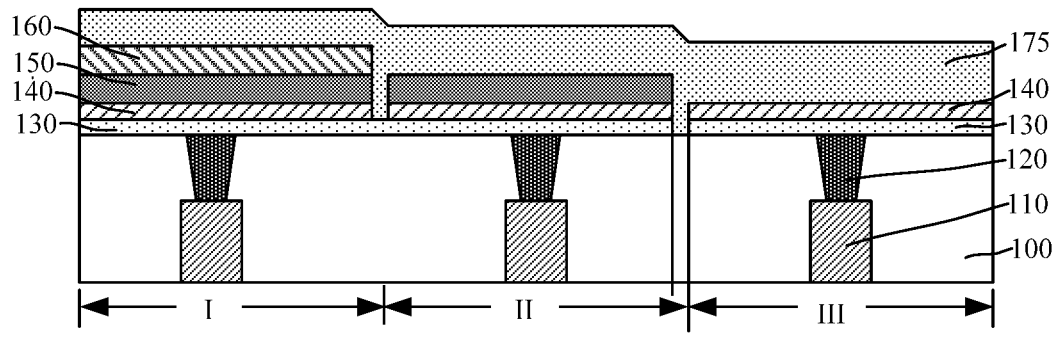
Figure 13:
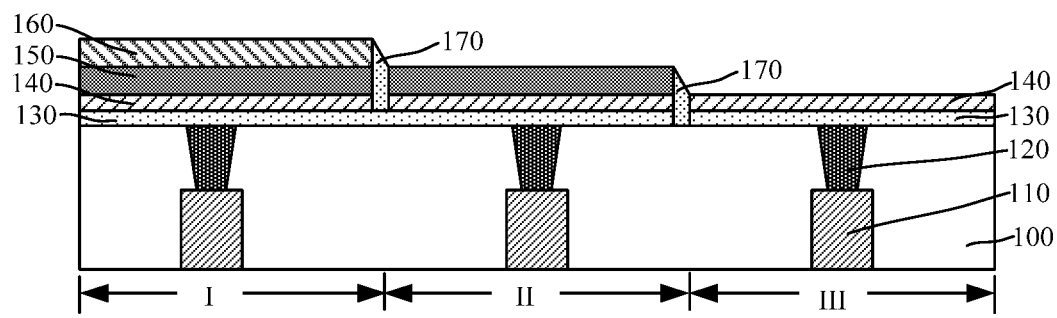

With reference to FIG. 12 and FIG. 13, after the compensation layer (not labeled) is formed, a step of forming an isolation layer 170 (shown in FIG. 13) filled up in the first isolation opening 151 (shown in FIG. 11) and the second isolation opening 152 (shown in FIG. 11) is further included.

The isolation layer 170 is configured to isolate adjacent pixels from one another.

In this embodiment, the step of forming the isolation layer 170 includes: filling up the first isolation opening 151 and the second isolation opening 152 with an isolation membrane 175 (shown in FIG. 12), which also covers a top of the compensation layer; and etching the isolation membrane 175 by a no-mask process, to remove the isolation membrane 175 on the top of the compensation layer while reaming the isolation membrane 175 in the first isolation opening 151 and the second isolation opening 152 as the isolation layer 170.

In this embodiment, the isolation membrane 175 is made of $SiO_2$, and the isolation membrane 175 is formed by a Plasma Enhanced Chemical Vapor Deposition (PECVD) process.

The PECVD process has advantages such as a low process temperature, a fast deposition rate, a good membrane formation quality, etc., and thus facilitates improving a formation quality of the isolation layer 170. Moreover, since the OLED device has a poor temperature resistance, the low process temperature can avoid an adverse effect on the performance of the formed pixel structure.

In other embodiments, the isolation membrane may also be made of SiN or SiON.

In this embodiment, in the step of etching the isolation membrane 175 by the no-mask process, the etching process thereof is a dry etching process.

The isolation membrane 175 on the top of the compensation layer can be better removed by the no-mask process, so as to prevent the isolation layer 170 from occupying an area of the compensation layer, thereby preventing the isolation layer 170 from occupying an area of a light-emitting area of the formed pixel structure.

Correspondingly, the present disclosure further provides a pixel structure.

FIG. 13 shows a schematic diagram of a structure of a pixel structure according to the first embodiment of the present disclosure. With further reference to FIG. 13, the pixel structure of the present disclosure includes: a substrate 100 for forming an OLED device, the substrate having a first pixel area I, a second pixel area II, and a third pixel area III; and a compensation layer (not labeled) located on the substrate 100, which has different thicknesses respectively in the first pixel area I, the second pixel area II and the third pixel area III.

For example, the OLED device is a top-emitting OLED device.

In this embodiment, the pixel structure is of an OLED on Silicon structure. An interconnection metal layer 110 and a conductive plug 120 electrically connected to the interconnection metal layer 110 are formed in the substrate 100. The substrate 100 exposes the conductive plug 120, thereby achieving circuit connection of the substrate 100 with the OLED device.

The first pixel area I, the second pixel area II, and the third pixel area III are configured to emit light of different colors. In this embodiment, the OLED device adopts an RGB filter, so the first pixel area I is a red light pixel area, the second pixel area II is a green light pixel area, and the third pixel area III is a blue light pixel area.

It should be noted that the pixel structure further includes an anode layer 130 located between the substrate 100 and the compensation layer.

The anode layer 130 may be formed as a single-layer structure or a stacked-layer structure. Specifically, the anode layer 130 may be a reflective metal layer, or the anode layer 130 includes a reflective metal layer and a transparent conductive layer located on the reflective metal layer. The reflective metal layer may be made of a metal such as Al, Ag or Cu, and the transparent conductive layer may be made of one or more of ITO, IZO, MoOx and AZO.

In this embodiment, the anode layer 130 is a reflective metal layer.

Since the Al material has high reflectivity, and an etching process for the Al material is relatively simple, the reflective metal layer is made of Al in this embodiment when taking an overall consideration of a process difficulty and a metal reflectivity.

It should be noted that in this embodiment, the anode layer 130 has a same thickness respectively in the first pixel area I, the second pixel area II, and the third pixel area III.

The compensation layer has different thicknesses respectively in the first pixel area I, the second pixel area II, and the third pixel area III, so that cavity lengths of the first pixel area I, the second pixel area II and the third pixel area III can be respectively modulated by the compensation layer in the first pixel area I, the second pixel area II and the third pixel area III. The OLED device can use a strong micro cavity effect to improve the light-emitting efficiency and color purity of the formed pixel structure, thereby improving the brightness and color gamut of the display screen.

Therefore, in this embodiment, the compensation layer is made of a highly transparent metal oxide. Specifically, the compensation layer is made of one or more of ITO, IZO, MoOx and AZO.

The first pixel area I is a red light pixel area, the second pixel area II is a green light pixel area, and the third pixel area III is a blue light pixel area. Since a wavelength of green light is smaller than a wavelength of red light and larger than a wavelength of blue light, in order to allow the subsequently formed OLED device to use a strong micro cavity effect, a cavity length of the second pixel area II is smaller than a cavity length of the first pixel area I and larger than a cavity length of the third pixel area III; and correspondingly, the thickness of the compensation layer in the second pixel area II is smaller than the thickness of the compensation layer in the first pixel area I and larger than the thickness of the compensation layer in the third pixel area III.

In this embodiment, the compensation layer in the first pixel area I and the compensation layer in the second pixel area II each is formed as a stacked-layer structure.

Specifically, the pixel structure further includes: a first compensation material layer 140 located on the anode layer 130 in the first pixel area I, the second pixel area II, and the third pixel area III; a second compensation material layer 150 located on the first compensation material layer 140 in the first pixel area I and the second pixel area II; and a third compensation material layer 160 located on the second compensation material layer 150 in the first pixel area I.

The first compensation material layer 140, the second compensation material layer 150, and the third compensation material layer 160 in the first pixel area I constitute the compensation layer in the first pixel area I. The first compensation material layer 140 and second compensation material layer 150 in the second pixel area II constitute the compensation layer in the second pixel area II. The first compensation material layer 140 in the third pixel area III constitutes the compensation layer in the third pixel area III.

By having the compensation layer in the first pixel area I, the second pixel area II and the third pixel area III be constituted by different compensation material layers, evaporation process and etching process of the compensation material layer can be alternately performed in such a manner that the compensation layer can have different thicknesses respectively in the first pixel area I, the second pixel area II, and the third pixel area III.

It should be noted that in this embodiment, in order to reduce difficulty of a subsequent process and improve process compatibility, the first compensation material layer 140, the second compensation material layer 150 and the third compensation material layer 160 are made of a same material.

It should be noted that only the first compensation material layer 140 is formed on the anode layer 130 in the third pixel area III, that is, the compensation layer in the third pixel area III is a single layer, so the thickness of the first compensation material layer 140 meets requirements of blue light pixels. Only the first compensation material layer 140 and the second compensation material layer 150 are formed on the anode layer 130 in the second pixel area II, that is, the compensation layer in the second pixel area II includes a stacked-layer structure formed by the first compensation material layer 140 and the second compensation material layer 150, so that a total thickness of the first compensation material layer 140 and the second compensation material layer 150 meets requirements of green light pixels. The first compensation material layer 140, the second compensation material layer 150 and the third compensation material layer 160 are formed on the anode layer 130 in first pixel area I, so that a total thickness of the first compensation material layer 140, the second compensation material layer 150 and the third compensation material layer 160 meets requirements of red light pixels.

Therefore, in this embodiment, according to actual process requirements, a thickness of the first compensation material layer 140 is within a range of 100 Å to 500 Å, a thickness of the second compensation material layer 150 is within a range of 300 Å to 700 Å, and a thickness of the third compensation material layer 160 is within a range of 300 Å to 700 Å.

In this embodiment, the pixel structure further includes an isolation layer 170. The isolation layer 170 penetrates at least the compensation layer and the anode layer 130 at the junction of the first pixel area I and the second pixel area II, and the compensation layer and the anode layer 130 at the junction of the second pixel area II and the third pixel area III.

The isolation layer 170 is configured to isolate adjacent pixels from one another.

In this embodiment, the isolation layer 170 is made of $SiO_2$. In other embodiments, the isolation layer may also be made of SiN or SiON.

In this embodiment, the isolation layer 170 only penetrates the compensation layer and the anode layer 130, that is, the isolation layer 170 is not formed on the top of the compensation layer, so that the isolation layer 170 does not occupy an area of the compensation layer, thereby preventing the isolation layer 170 from occupying an area of a light-emitting area of the pixel structure.

The pixel structure of the present disclosure is formed by the pixel structure forming method in the first embodiment described above. For detailed descriptions of the pixel structure, reference may be made to corresponding descriptions of the forming method in the first embodiment described above, and details thereof will not be further described herein.

In addition, the present disclosure further provides a display screen, which includes a number of pixel structures according to the first embodiment of the present disclosure.

The compensation layer has different thicknesses in the first pixel area I, the second pixel area II, and the third pixel area III, so that cavity lengths of the first pixel area I, the second pixel area II, and the third pixel area III can be individually modulated. Therefore, the OLED device can use the strong micro cavity effect to improve the light-emitting efficiency and improve the color purity, thereby improving the brightness and the color gamut of the display screen.

Figure 14:
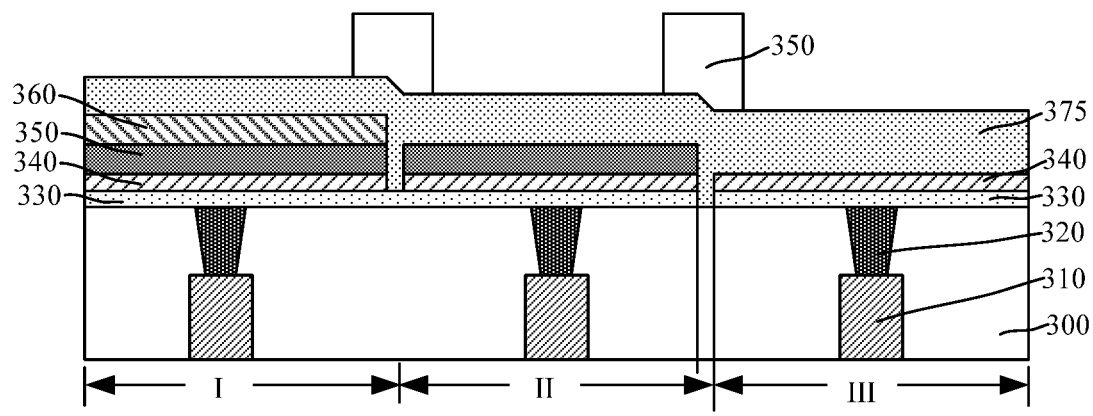
FIG. 14 and FIG. 15 are schematic diagrams illustrating structures corresponding to respective steps of a method for forming a pixel structure according to a second embodiment of the present disclosure.
Figure 15:
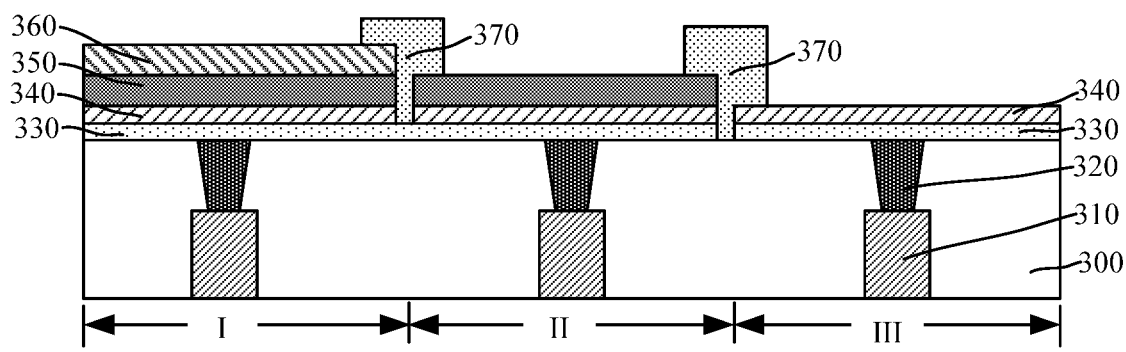
Figure 16:
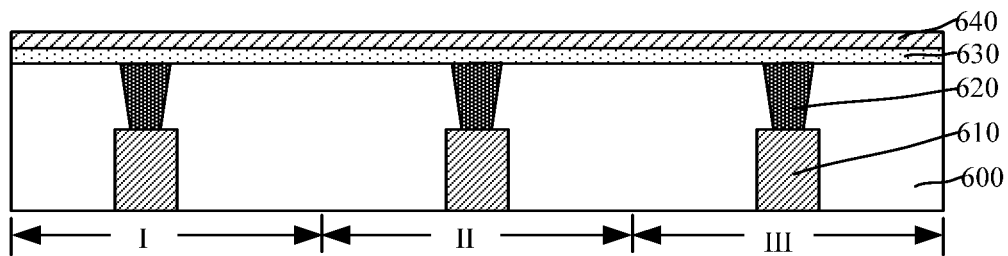
FIG. 16 to FIG. 24 are schematic diagrams illustrating structures corresponding to respective steps of a method for forming a pixel structure according to a third embodiment of the present disclosure.

FIG. 14 and FIG. 15 are schematic diagrams illustrating structures corresponding to respective steps of a method for forming a pixel structure according to a second embodiment of the present disclosure The forming method in this embodiment that is the same as the forming method in the first embodiment will not be further described herein. The forming method of this embodiment differs from the forming method of the first embodiment in that, the step of forming the isolation layer 370 (shown in FIG. 15) includes: filling up the first isolation opening (shown in FIG. 14 but not labeled) and the second isolation opening (shown in FIG. 14 but not labeled) with an isolation Membrane 375 (shown in FIG. 14), which also covers the top of the compensation layer (not labeled); forming a third photoresist layer 350 on the isolation membrane 375 in an area corresponding to the first isolation opening and the second isolation opening (shown in FIG. 14); etching the isolation membrane 375 with the third photoresist layer 350 as a mask, with the remaining isolation membrane 375 as the isolation layer 370; and removing the third photoresist layer 350.

Correspondingly, the isolation layer 370 also covers the top of the compensation layer at the junction of the first pixel area I and the second pixel area II, and the top of the compensation layer at the junction of the second pixel area II and the third pixel area III.

By adopting a combination of photolithography and etching processes, loss of the isolation membrane 375 in the area corresponding to the first isolation opening and the second isolation opening can be avoided, thereby ensuring an effect of the isolation layer 370 covering corners of the sidewall and top of the compensation layer. This can facilitate a subsequent deposition effect of other layers, thereby facilitating improving the performance of the formed pixel structure.

In this embodiment, the isolation membrane 375 exposed by the pattern layer 350 is etched by dry etching. After the isolation layer 370 is formed, the third photoresist layer 350 is removed by an ashing or a wet degumming process.

Correspondingly, the present disclosure further provides a pixel structure.

FIG. 15 is a schematic diagrams illustrating a structure of a pixel structure according to a second embodiment of the present disclosure. With further reference to FIG. 15, the pixel structure in this embodiment that is the same as the pixel structure in the first embodiment will not be further described herein. The pixel structure of this embodiment differs from the pixel structure of the first embodiment in that the isolation layer 370 also covers the top of the compensation layer at the junction of the first pixel area I and the second pixel area II and the top of the compensation layer at the junction of the second pixel area II and the third pixel area III.

The isolation layer 370 also covers the top of the compensation layer, thereby avoiding exposure of the top of the compensation layer at the corners. Therefore, this can facilitate a subsequent deposition effect of other layers, thereby facilitating improving the performance of the pixel structure.

The pixel structure of the present disclosure is formed by the pixel structure forming method in the second embodiment described above. For detailed descriptions of the pixel structure, reference may be made to corresponding descriptions of the forming method in the second embodiment described above, and details thereof will not be further described herein.

In addition, the present disclosure further provides a display screen, which includes a number of pixel structures according to the second embodiment of the present disclosure.

The compensation layer has different thicknesses respectively in the first pixel area I, the second pixel area II, and the third pixel area III, thereby improving brightness and color gamut of the display screen.

FIG. 16 to FIG. 24 are schematic diagrams illustrating structures corresponding to respective steps of a method for forming a pixel structure according to a third embodiment of the present disclosure.

The forming method in this embodiment that is the same as the forming method in the first embodiment will not be further described herein. The forming method of this embodiment differs from the forming method of the first embodiment in the following.

Figure 20:
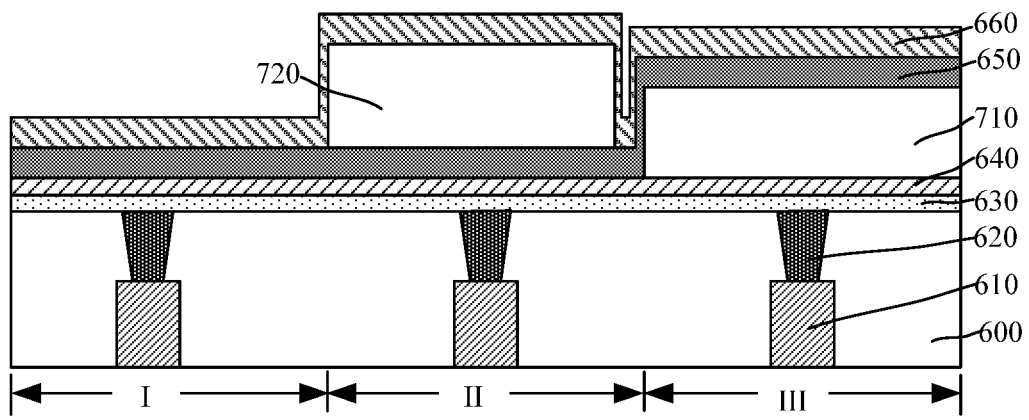

The step of forming the compensation layer (not labeled) on the substrate 600 includes: forming a first compensation material layer 640 on the anode layer 630; forming a second compensation material layer 650 on the first compensation material layer 640 (as shown in the FIG. 18); forming a third compensation material layer 660 on the second compensation material layer 650 (as shown in FIG. 20); removing the third compensation material layer 660 in the third pixel area III and the second compensation material layer 660 in the third pixel area III; and removing the third compensation material layer 660 in the second pixel area II. In this way, the first compensation material layer 640, the second compensation material layer 650, and the third compensation material layer 660 in the first pixel area I constitute the compensation layer in the first pixel area I; the first compensation material layer 640 and the second compensation material layer 650 in the second pixel area II constitute the compensation layer in the second pixel area II; the first compensation material layer 640 in the third pixel area III constitutes the compensation layer in the third pixel area III.

In this embodiment, a thickness of the first compensation material layer 640 is within a range of 100 Å to 500 Å, a thickness of the second compensation material layer 650 is within a range of 300 Å to 700 Å, and a thickness of the third compensation material layer 660 is within a range of 300 Å to 700 Å.

For detailed descriptions of the first compensation material layer 640, second compensation material layer 650, and third compensation material layer 660, reference may be made to corresponding descriptions of the forming method in the first embodiment described above, and details thereof will not be further described herein.

For detailed descriptions of steps of forming the first compensation material layer 640, reference may be made to the corresponding descriptions of the forming method in the first embodiment described above, and details thereof will not be further described herein in this embodiment.

Figure 17:
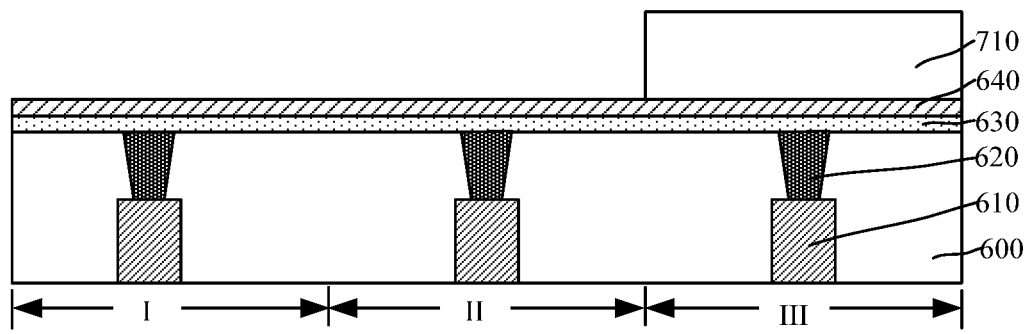
Figure 18:
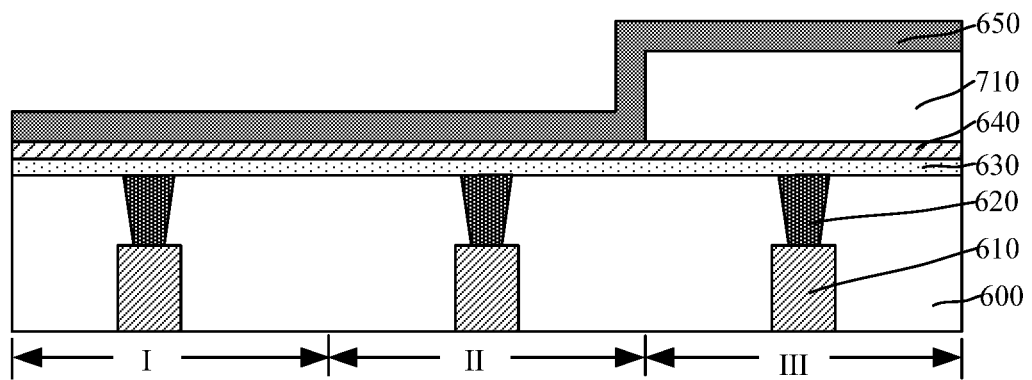

With reference to FIG. 17 and FIG. 18, specifically, forming the second compensation material layer 650 includes: forming a first sacrifice layer 710 on the first compensation material layer 640 in the third pixel area III; and forming a second compensation material layer 650 covering the first compensation material layer 640 in the first pixel area I and the second pixel area II and the first sacrifice layer 710.

In this embodiment, the first sacrifice layer 710 is made of a photoresist, and the first sacrifice layer 710 is formed by an exposure development process.

It should be noted that in the embodiment, after the first sacrifice layer 710 is formed, the first sacrifice layer 710 also exposes the first compensation material layer 640 at the junction of the second pixel area II and the third pixel area III, thereby providing a process basis for subsequently forming a first isolation opening exposing the substrate 600 at the junction of the second pixel area II and the third pixel area III.

For detailed descriptions of the first sacrifice layer 710, reference may be made to the corresponding descriptions of the forming method in the first embodiment described above, and details thereof will not be further described herein in this embodiment.

Figure 19:
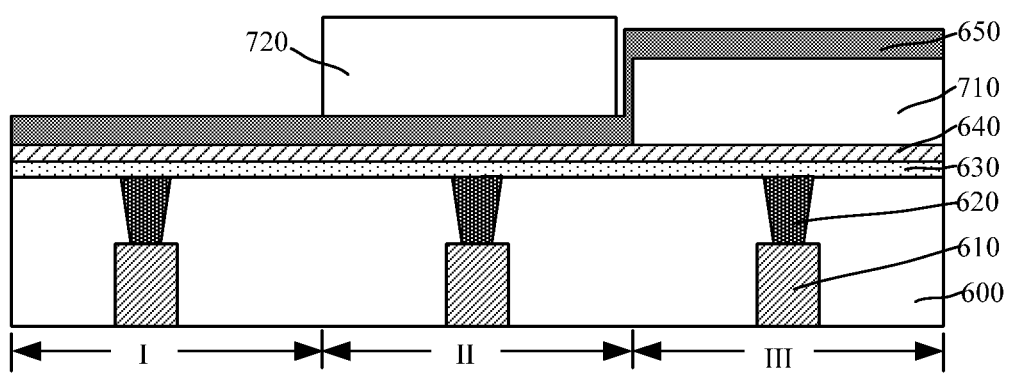

With reference to FIG. 19 and FIG. 20, specifically, the step of forming the third compensation material layer 660 includes: forming a second sacrifice layer 720 on the second compensation material layer 650 in the second pixel area II (as shown in FIG. 19); and forming a third compensation material layer 660 covering the second compensation material layer 650 in the first pixel area I and the third pixel area III and the second sacrifice layer 720.

In this embodiment, the second sacrifice layer 720 is made of a photoresist and formed by an exposure development process.

It should be noted that in this embodiment, after the second sacrifice layer 720 is formed, the second sacrifice layer 720 also exposes the second compensation material layer 650 at the junction of the second pixel area II and the third pixel area III and at the junction of the first pixel area I and the second pixel area II, thereby providing a process basis for subsequently forming a first isolation opening exposing the substrate 600 at the junction of the second pixel area II and the third pixel area III and forming a second isolation opening exposing the substrate 600 at the junction of the first pixel area I and the second pixel area II.

For detailed descriptions of the second sacrifice layer 720, reference may be made to the corresponding descriptions of the forming method in the first embodiment described above, and details thereof will not be further described herein in this embodiment.

Figure 21:
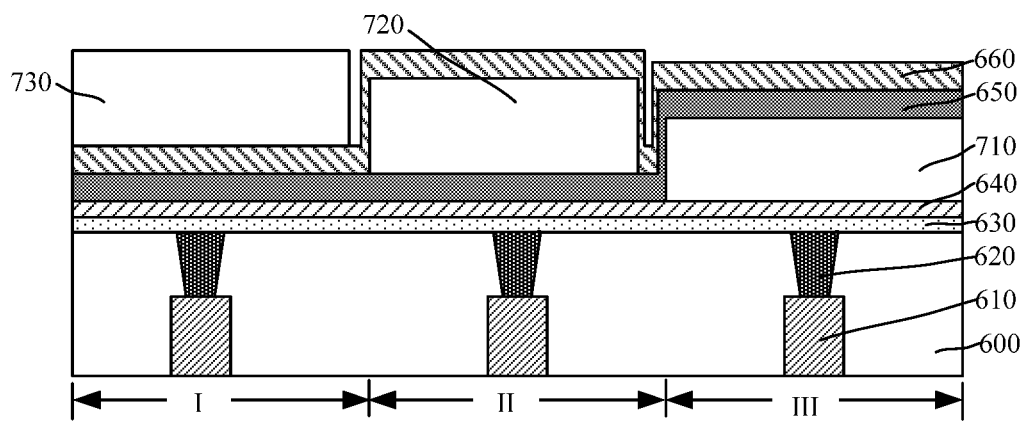
Figure 22:
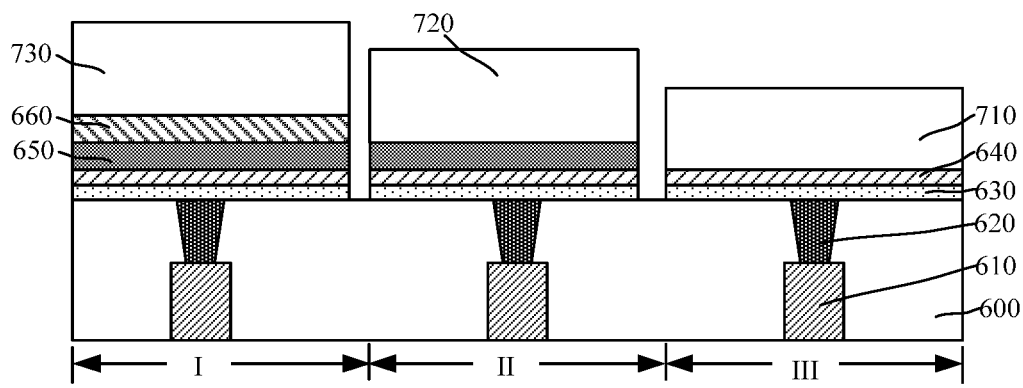
Figure 23:
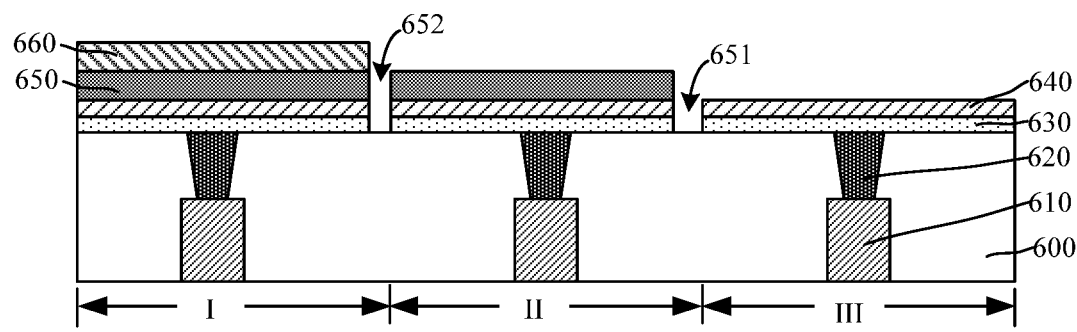

Therefore, with reference to FIG. 21 to FIG. 23, the step of removing the third compensation material layer 660 in the third pixel area III and the second compensation material layer 650 in the third pixel area III and the third compensation material layer 660 in the second pixel area II includes: forming a fourth photoresist layer 730 (as shown in FIG. 21) on the third compensation material layer 660 in the first pixel area I; etching and removing the third compensation material layer 660 in the third pixel area III and the second compensation material layer 650 in the third pixel area III and the third compensation material layer 660 in the second pixel area II by using the fourth photoresist layer 730 as a mask; and removing the fourth photoresist layer 730, the first sacrifice layer 710, and the second sacrifice layer 720.

It should be noted that in this embodiment, after the fourth photoresist layer 730 is formed, the fourth photoresist layer 730 also exposes the third compensation material layer 660 at the junction of the first pixel area I and the second pixel area II, thereby providing a process basis for subsequently forming a second isolation opening exposing the substrate 600 at the junction of the first pixel area I and the second pixel area II.

The fourth photoresist layer 730, the first sacrifice layer 710, and the second sacrifice layer 720 are all made of photoresist materials, and thus so as shown in FIG. 23, the fourth photoresist layer 730, the first sacrifice layer 710 and the second sacrifice layer 720 can be removed in a same step. Correspondingly, a process difficulty of removing the fourth photoresist layer 730, the first sacrifice layer 710 and the second sacrifice layer 720 is reduced, thereby saving process time.

In this embodiment, the fourth photoresist layer 730, the first sacrifice layer 710 and the second sacrifice layer 720 are removed by an ashing or a wet degumming process.

It should be noted that, in the step of removing the third compensation material layer 660 in the third pixel area III and the second compensation material layer 650 in the third pixel area III, the third compensation material layer 660 and the second compensation material layer 650, the first compensation material layer 640 and the anode layer 630 at the junction of the second pixel area II and the third pixel area III are also removed, such that a first isolation opening 651 (as shown in FIG. 23) exposing the substrate 100 at the junction of the second pixel area II and the third pixel area III is formed. In the step of removing the third compensation material layer 660 in the second pixel area II, the third compensation material layer 660 and the second compensation material layer 650, the first compensation material layer 640 and the anode layer 630 at the junction of the first pixel area I and the second pixel area II are also removed, such that a second isolation opening 652 (shown in FIG. 23) exposing the substrate 100 at the junction of the first pixel area I and the second pixel area II is formed.

In this embodiment, the first compensation material layer 640, the second compensation material layer 650, and the third compensation material layer 660 in the first pixel area I constitute the compensation layer in the first pixel area I. The first compensation material layer 640 and the second compensation material layer 650 in the second pixel area II constitute the compensation layer in the second pixel area II. The first compensation material layer 640 in the third pixel area III constitutes the compensation layer in the third pixel area III. The compensation layer in the first pixel area I, the compensation layer in the second pixel area II, and the compensation layer in the third pixel area III are separated from one another.

In this embodiment, in order to better control a topography of the remaining third compensation material layer 660, second compensation material layer 650, first compensation material layer 640 and anode layer 630, etching is performed by a dry etching process.

A bottom of the compensation layer in the first pixel area I, a bottom of the compensation layer in the second pixel area II, and a bottom of the compensation layer in the third pixel area III are flush, while there are height differences among a top of the compensation layer in the first pixel area I, a top of the compensation layer in the second pixel area II, and a top of the compensation layer in the third pixel area III. In this way, the cavity length of the first pixel area I, the cavity of the second pixel area II, and the cavity of the third pixel area III can be individually modulated.

In addition, through the fourth photoresist layer 730, the first sacrifice layer 710, and the second sacrifice layer 720, the compensation layer can have different thicknesses respectively in the first pixel area I, the second pixel area II, and the third pixel area III, and less masks are used, thereby facilitating reducing the cost of the process. An interconnection metal layer 610 and a conductive plug 620 electrically connected to the interconnection metal layer 610 are formed in the substrate 600, and the substrate 600 exposes the conductive plug 620.

Figure 24:
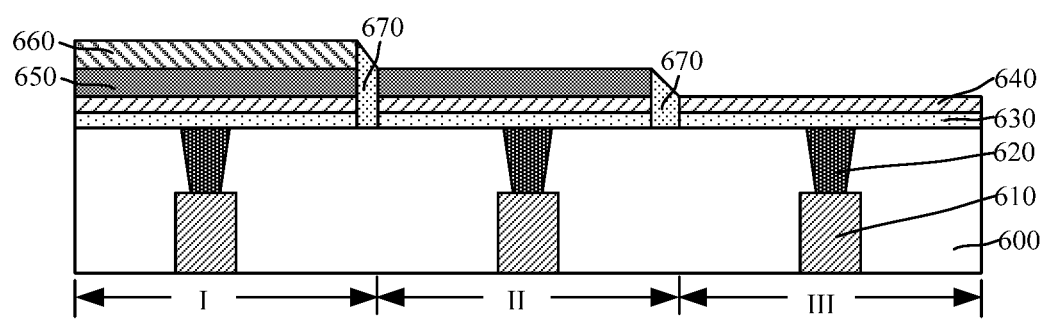

With reference to FIG. 24, after the compensation layer (not labeled) is formed, the method further includes: forming an isolation layer 670 filled up in the first isolation opening 651 (shown in FIG. 23) and the second isolation opening 652 (shown in FIG. 23).

In this embodiment, the step of forming the isolation layer 670 includes: filling up the first isolation opening 651 and the second isolation opening 652 with an isolation membrane, which also covers the top of the compensation layer; etching the isolation membrane by using a no-mask process, to remove the isolation membrane on the top of the compensation layer while remaining the isolation membrane in the first isolation opening 651 and the second isolation opening 652 as the isolation layer 670.

For detailed descriptions of the isolation layer 670, reference may be made to the corresponding descriptions of the forming method in the first embodiment described above, and details thereof will not be further described herein in this embodiment.

In other embodiments, forming the isolation layer may further include: filling up the first isolation opening and the second isolation opening with an isolation membrane, which further covers the top of the compensation layer; forming a second pattern layer on the isolation membrane in an area corresponding to the first isolation opening and the second isolation opening; and etching the isolation membrane by using the second pattern layer as a mask. The remaining isolation membrane is used as the isolation layer.

For detailed descriptions of forming the isolation layer, reference may be made to the corresponding descriptions of the forming method in the second embodiment described above, and details thereof will not be further described herein in this embodiment.

FIG. 25 to FIG. 34 are schematic diagrams illustrating structures corresponding to respective steps of a method for forming a pixel structure according to a fourth embodiment of the present disclosure.

The forming method in this embodiment that is the same as the forming method in the first embodiment will not be further described herein. The forming method of this embodiment differs from the forming method of the first embodiment in that the anode layer (not labeled) has different thicknesses respectively in the first pixel area I, the second pixel area II, and the third pixel area III.

Therefore, after the anode layer is formed, an isolation layer having a flat top surface is subsequently formed on the anode layer, an opening exposing the anode layer is formed in the isolation layer in the first pixel area I, the second pixel area II, and the third pixel area III, and the opening is filled up with the compensation material layer to form a compensation layer having a flat top surface. By having height differences among top surfaces of the anode layer in the first pixel area I, the second pixel area II and the third pixel area III, the opening in the isolation layer has different depths respectively in the first pixel area I, the second pixel area II, and the third pixel area III. Correspondingly, after the opening is filled up with the compensation material layer, the compensation layer has different thicknesses respectively in the first pixel area I, the second pixel area II, and the third pixel area III, so that the cavity length of the first pixel area I, the cavity length of the second pixel area II, and the cavity length of the third pixel area III can be individually modulated.

That is, the larger thickness of the anode layer leads to the smaller thickness of the compensation layer in the corresponding pixel area.

In this embodiment, the first pixel area I is a red light pixel area, the second pixel area II is a green light pixel area, and the third pixel area III is a blue light pixel area.

Correspondingly, the thickness of the anode layer in the second pixel area II is larger than the thickness of the anode layer in the first pixel area I and smaller than the thickness of the anode layer in the third pixel area III.

The step of forming the anode layer will be described in details in the following with reference to the accompanying drawings.

Figure 25:
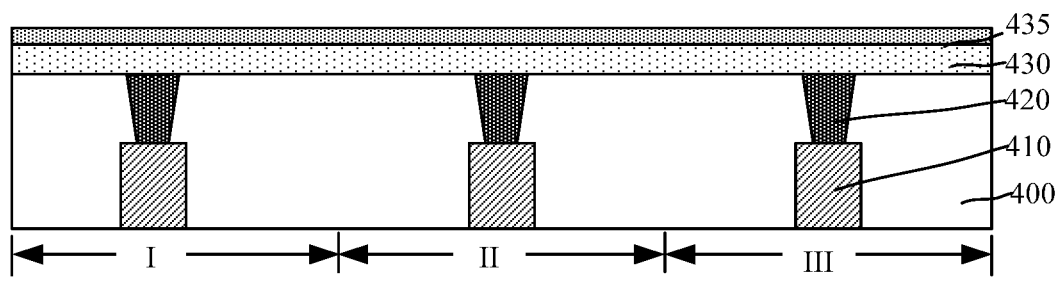
FIG. 25 to FIG. 34 are schematic diagrams illustrating structures corresponding to respective steps of a method for forming a pixel structure according to a fourth embodiment of the present disclosure.

With reference to FIG. 25, a first anode material layer (not labeled) is formed on the substrate 400.

For descriptions of the substrate 400, reference may be made to the corresponding descriptions of the forming method in the first embodiment described above, and details thereof will not be further described herein in this embodiment.

The first anode material layer is used as a part of the subsequently formed anode layer.

It should be noted that only the first anode material layer is subsequently formed on only the substrate 400 in the second pixel area II and the third pixel area III, and the subsequent step further includes: forming a second anode material layer only on the first anode material layer in the third pixel area III. So, the thickness of the first anode material layer needs to meet requirements of green light pixels, and the first anode material layer in the second pixel area II affects the cavity length of the second pixel area II.

Therefore, under a premise that the thickness of the first anode material layer is allowed to meet the requirements of the green light pixels, the thickness of the first anode material layer is reasonably set. In this embodiment, the first anode material layer has a thickness of 300 Å to 700 Å.

In this embodiment, the first anode material layer includes a first reflective metal layer 430 and a first transparent conductive layer 435 located on the first reflective metal layer 430. In other embodiments, the first anode material layer may include only the first reflective metal layer.

For descriptions of the first reflective metal layer 430, reference may be made to the corresponding descriptions of the reflective metal layer in the forming method in the first embodiment described above; For descriptions of the first transparent conductive layer 435, reference may be made to the corresponding descriptions of the transparent conductive layer in the forming method in the first embodiment described above, and details thereof will not be further described herein.

In this embodiment, the first anode material layer is formed by an evaporation process. Specifically, the evaporation process is a physical vapor deposition process.

It should be noted that the first reflective metal layer 430 is prone to be oxidized when being exposed to air, causing an increase in a resistance of the anode layer, thereby causing a decrease in the performance of the formed pixel structure. To this end, in this embodiment, the first transparent conductive layer 435 protects the first reflective metal layer 430 in a subsequent process by using the first reflective metal layer 430 and the first transparent conductive layer 435 as a first anode material layer with a stacked-layer structure. In this way, a problem that the first reflective metal layer 430 is oxidized by contact with the air can be avoided, and the first reflective metal layer 430 can be prevented from being damaged or lost by etching.

Correspondingly, in the process of forming the first anode material layer, the first reflective metal layer 430 and the first transparent conductive layer 435 are formed by continuous deposition, that is, the first reflective metal layer 430 and the first transparent conductive layer 435 are formed in a same machine while keeping vacuum.

The thickness of the first transparent conductive layer 435 should not be too small or too large. If the thickness of the first transparent conductive layer 435 is too small, the first transparent conductive layer 435 has a poor protection effect on the first reflective metal layer 430 during a subsequent process, and then the first reflective metal layer 430 is easily subjected to being damaged or lost by etching. If the thickness of the first transparent conductive layer 435 is too large, material waste is caused, and in a case where the thickness of the subsequently formed isolation layer is constant, the thickness of the compensation layer in the second pixel area II and the third pixel area III is too small, which would easily reduce the performance of the formed pixel structure. To this end, in this embodiment, the thickness of the first transparent conductive layer 435 is within a range of 50 Å to 150 Å.

Figure 26:
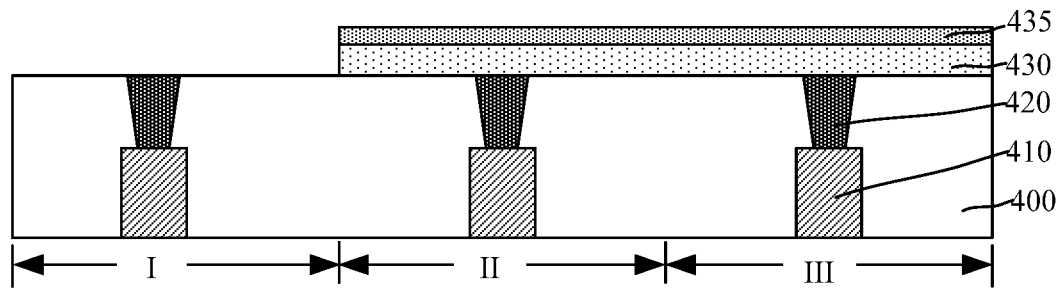

With reference to FIG. 26, the first anode material layer (not labeled) in the first pixel area I is removed, thereby exposing the substrate 400 in the first pixel area I.

By removing the first anode material layer in the first pixel area I, the thickness of the anode layer in the first pixel area I formed later is reduced, thereby increasing the thickness of the compensation layer in the first pixel area I that is formed later.

Specifically, removing the first anode material layer in the first pixel area I includes: forming a fifth photoresist layer on the first anode material layer in the second pixel area II and the third pixel area III; etching and removing the first anode material layer in the first pixel area I by using the fifth photoresist layer as a mask; and removing the fifth photoresist layer.

In this embodiment, in order to better control a sidewall morphology of the remaining first anode material layer, the first anode material layer in the first pixel area I is removed by a dry etching process.

In other embodiments, the etching may be performed by a wet etching process, or an etching process combining a dry etching process and a wet etching process.

Figure 27:
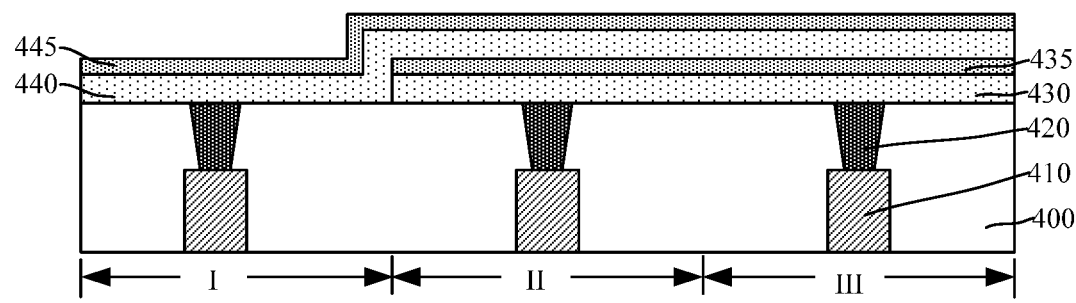

With reference to FIG. 27, after the first anode material layer (not labeled) in the first pixel area I is removed, a second anode material layer (not labeled) is formed on the substrate 400 in the first pixel area I and on the first anode material layer.

The second anode material layer is used as a part of the subsequently formed anode layer.

It should be noted that only the second anode material layer is subsequently formed on the first anode material layer in the third pixel area III, and the subsequent step further includes: forming a third anode material layer on the substrate 400 in the first pixel area I, on the first anode material layer in the second pixel area II, and on the second anode material layer in the third pixel area III. Therefore, the thickness of the second anode material layer needs to meet requirements of the blue light pixels. The second anode material layer in the third pixel area III affects the cavity length of the third pixel area III.

Therefore, in a premise that the thickness of the second anode material layer is allowed to meet the requirements of the blue light pixels, the thickness of the second anode material layer is reasonably set. In this embodiment, the thickness of the second anode material layer is within a range of 300 Å to 700 Å.

In this embodiment, the second anode material layer includes a second reflective metal layer 440 and a second transparent conductive layer 445 located on the second reflective metal layer 440. In other embodiments, the first anode material layer may include only the first reflective metal layer.

For descriptions of the second reflective metal layer 440, reference may be made to the corresponding descriptions of the reflective metal layer in the forming method in the first embodiment described above, for descriptions of the second transparent conductive layer 445, reference may be made to the corresponding descriptions of the transparent conductive layer in the forming method in the first embodiment described above, and details thereof will not be further described herein.

In this embodiment, the second anode material layer is formed by an evaporation process. Specifically, the evaporation process is a physical vapor deposition process.

The second transparent conductive layer 445 is configured to protect the second reflective metal layer 440 in a subsequent process, thereby preventing the second reflective metal layer 440 from being in contact with air, which would otherwise cause oxidation, and also preventing the second reflective metal layer 440 from being damaged or lost by etching.

Correspondingly, in the process of forming the second anode material layer, the second reflective metal layer 440 and the second transparent conductive layer 445 are formed by continuous deposition, that is, the second reflective metal layer 440 and the second transparent conductive layer 445 are formed in a same machine while keeping vacuum.

In this embodiment, the thickness of the second transparent conductive layer 445 is within a range of 50 Å to 150 Å. For an analysis of setting the thickness of the second transparent conductive layer 445, reference may be made to the analysis of setting the thickness of the first transparent conductive layer 435 described above, and details will not be further described herein.

Figure 28:
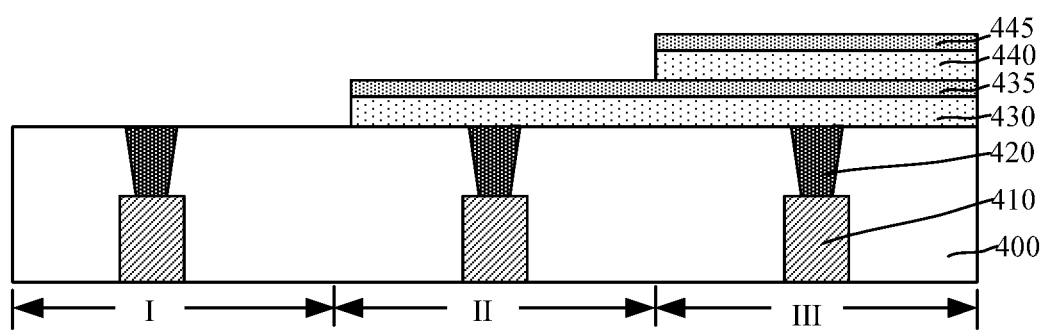

With reference to FIG. 28, the second anode material layer (not labeled) in the first pixel area I and the second pixel area II is removed, thereby exposing the substrate 400 in the first pixel area I and the first anode material layer (not labeled) in the second pixel area II.

By removing the second anode material layer in the first pixel area I and the second pixel area II, the thickness of the anode layer in the first pixel area I and the second pixel area II formed later is reduced, thereby increasing the thickness of the compensation layer in first pixel area I and the second pixel area II formed later, and further, the thickness of the compensation layer in the first pixel area I is larger than the thickness of the compensation layer in the second pixel area II.

Specifically, removing the second anode material layer in the first pixel area I and the second pixel area II includes: forming a sixth photoresist layer (not shown) on the second anode material layer in the third pixel area III; etching and removing the second anode material layer in the first pixel area I and the second pixel area II by using the sixth photoresist layer as a mask; and removing the sixth photoresist layer.

In this embodiment, in order to better control a sidewall morphology of the remaining second anode material layer, the second anode material layer in the first pixel area I and the second pixel area II is removed by dry an etching process.

In other embodiments, the etching may be performed by a wet etching process, or an etching process combining a dry etching process and a wet etching process.

Since the first transparent conductive layer 435 is formed between the first reflective metal layer 430 in the second pixel area II and the second reflective metal layer 440, the etching process can well stop at the top of the first transparent conductive layer 435, thereby improving the etching effect on the second anode material layer while avoiding over-etching.

Figure 29:
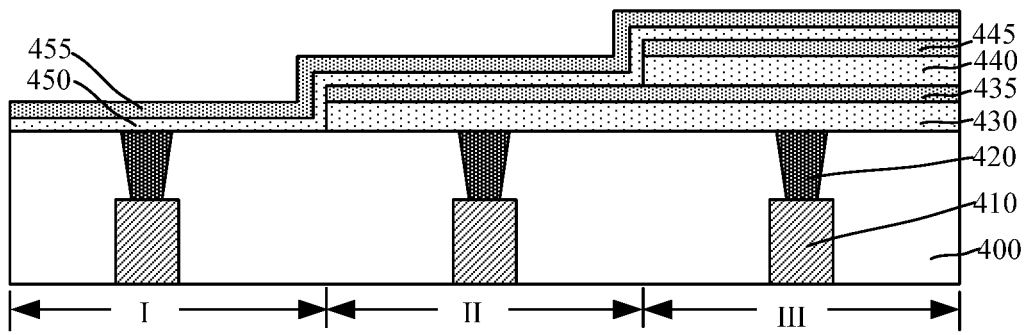

With reference to FIG. 29, a third anode material layer (not labeled) is formed on the substrate 400 in the first pixel area I, on the first anode material layer (not labeled) in the second pixel area II, and the second anode material layer (not labeled) in the third pixel area III.

The third anode material layer serves as a part of the subsequently formed anode layer.

It should be noted that only the third anode material layer is formed on the substrate 400 in the first pixel area I, so the thickness of the third anode material layer needs to meet requirements of red pixel pixels. The third anode material layer in the first pixel area I affects the cavity length of the first pixel area I.

Therefore, under a premise that the thickness of the third anode material layer meets the requirements of the red light pixels, the thickness of the third anode material layer is reasonably set. In this embodiment, the thickness of the third anode material layer is within a range of 100 Å to 500 Å.

In this embodiment, the third anode material layer includes a third reflective metal layer 450 and a third transparent conductive layer 455 located on the third reflective metal layer 450. In other embodiments, the third anode material layer may include only the third reflective metal layer.

For descriptions of the third reflective metal layer 450, reference may be made to the corresponding descriptions of the reflective metal layer in the forming method in the first embodiment described above, for descriptions of the third transparent conductive layer 455, reference may be made to the corresponding descriptions of the transparent conductive layer in the forming method in the first embodiment described above, and details thereof will not be further described herein.

In this embodiment, the third anode material layer is formed by an evaporation process. Specifically, the evaporation process is a physical vapor deposition process.

The third transparent conductive layer 455 is configured to protect the third reflective metal layer 450 in a subsequent process, thereby preventing the third reflective metal layer 450 from being contact with air, which would otherwise causes oxidation, and also preventing the third reflective metal layer 450 from being damaged or lost by etching.

Correspondingly, in the process of forming the third anode material layer, the third reflective metal layer 450 and the third transparent conductive layer 455 are formed by continuous deposition, that is, the third reflective metal layer 450 and the third transparent conductive layer 455 are formed in a same machine while keeping vacuum.

In this embodiment, the thickness of the third transparent conductive layer 455 is within a range of 50 Å to 150 Å. For an analysis of setting the thickness of the third transparent conductive layer 455, reference may be made to the analysis of setting the thickness of the first transparent conductive layer 435 described above, and details will not be further described herein.

Figure 30:
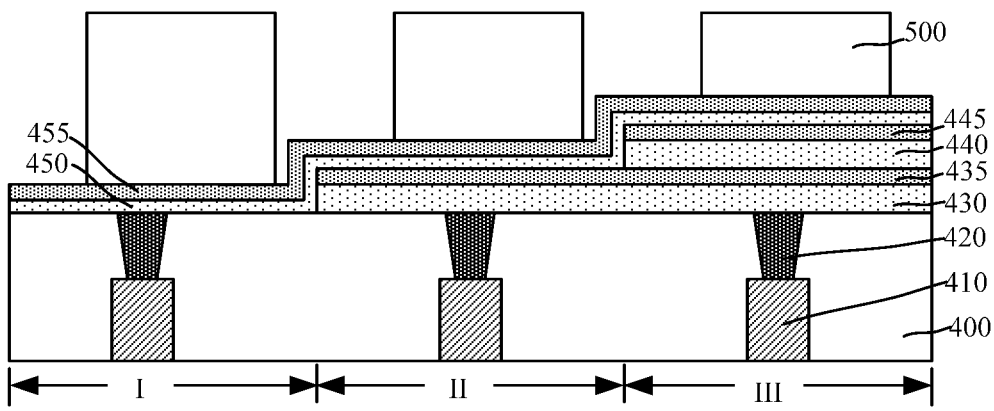
Figure 31:
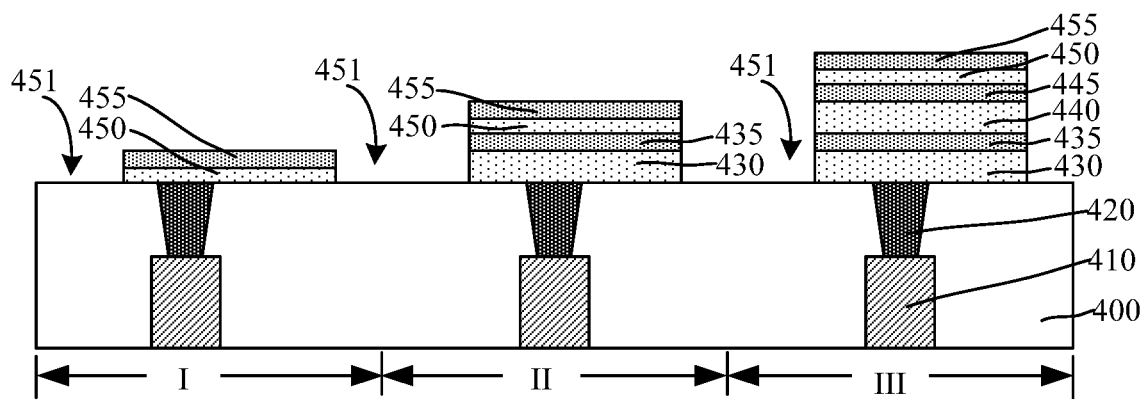

With reference to FIG. 30 and FIG. 31, it should be further noted that, in order to isolate adjacent pixels from one another, the anode layer in the first pixel area I, the anode layer in the second pixel area II, and the anode layer in the third pixel area III are separated from one another, and an isolation opening 451 (shown in FIG. 31) exposing the substrate 400 is formed between adjacent anode layers.

The isolation opening 451 provides a space for subsequent formation of the isolation layer.

Therefore, after the third anode material layer is formed, the method further includes: forming on a part of the third anode material layer (not labeled) in the first pixel area I, the second pixel area II and the third pixel area III a seventh photoresist layer 500 (shown in FIG. 30), which exposes the third anode material layer at the junction of the first pixel area I and the second pixel area II and also exposes the third anode material layer at the junction of the second pixel area II and the third pixel area III; etching the exposed third anode material layer, the second anode material layer (not labeled), and the first anode material layer (not labeled) by using the seventh photoresist layer 500 as a mask, so as to form the isolation opening 451 exposing the substrate 400; and removing the seventh photoresist layer 500.

In this embodiment, in order to better control a sidewall morphology of the remaining third anode material layer, second anode material layer and first anode material layer, etching is performed by a dry etching process.

In other embodiments, the etching may be performed by a wet etching process, or an etching process combining a dry etching process and a wet etching process.

After the isolation opening 451 is formed, the third anode material layer in the first pixel area I constitutes the anode layer in the first pixel area I; the third anode material layer and the first anode material layer (not labeled) in the second pixel area II constitute the anode layer in the second pixel area II; and the third anode material layer, the second anode material layer, and the first anode material layer (not labeled) in the third pixel area III constitute the anode layer in the third pixel area III.

Figure 32:
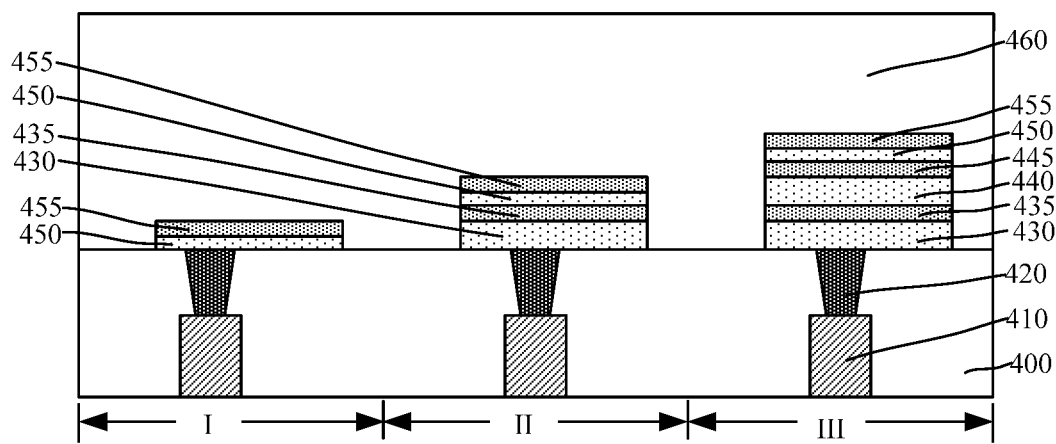
Figure 33:
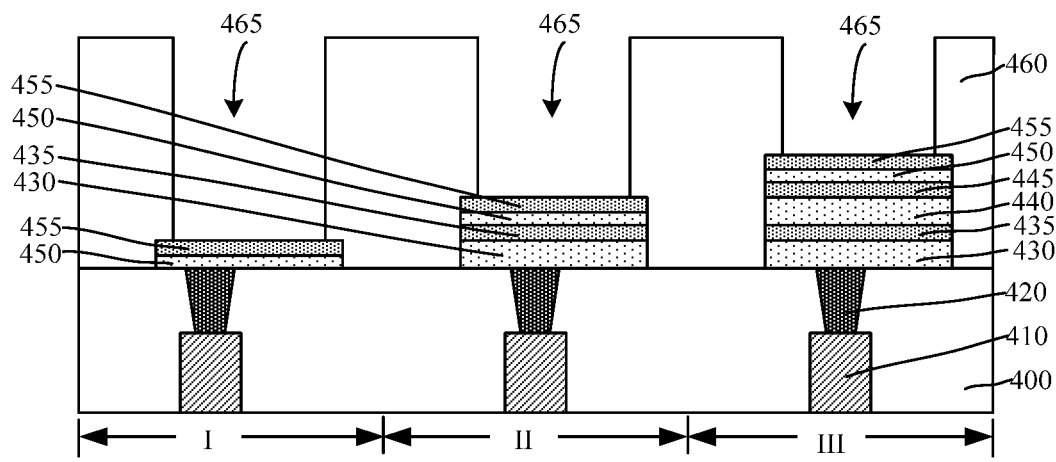
Figure 34:
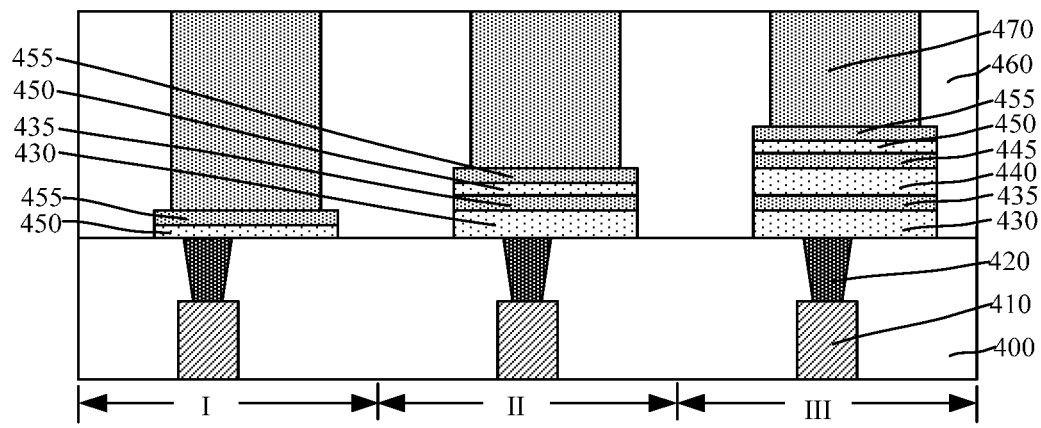

With reference to FIG. 32-34, forming the compensation layer (not labeled) includes: forming an isolation membrane (not labeled) covering the anode layer (not labeled); performing a first planarization treatment on the isolation membrane, with the remaining isolation membrane as the isolation layer 460 (as shown in FIG. 32); etching the isolation layer 460 to form an opening 465 (shown in FIG. 33) exposing the anode layer in the isolation layer 460 in the first pixel area I, the second pixel area II, and the third pixel area III; filling up the opening 465 with a compensation material layer; and performing a second planarization treatment on the compensation material layer, with the remaining compensation material layer as the compensation layer 470 (as shown in FIG. 34).

In this embodiment, an opening 451 exposing the substrate 400 is disposed between adjacent anode layers, and thus the isolation layer 460 is further filled in the isolation opening 451.

In a case where the thicknesses of the first anode material layer, the second anode material layer, and the third anode material layer are constant, the thickness of the compensation layer 470 depends on the thickness of the isolation layer 460. To this end, in this embodiment, the thickness of the isolation layer 460 is within a range of 1000 Å to 2000 Å according to actual process requirements.

Specifically, forming the opening 465 includes: forming an eighth photoresist layer (not shown) on the isolation layer 460 in the first pixel area I, the second pixel area II, and the third pixel area III; etching the isolation layer 460 by using the eighth film layer as a mask to form an opening 465 exposing the anode layer in the isolation layer 460 in the first pixel area I, the second pixel area II, and the third pixel area III; and removing the eighth photoresist layer.

It should be noted that, in order to reduce a process difficulty of the photolithography process, after the opening 465 is formed, the remaining isolation layer 460 also covers parts of the anode layer in the first pixel area I, the second pixel area II, and the third pixel area III, that is, the opening 465 exposes parts of the anode layer.

In this embodiment, the compensation layer 470 is made of a highly transparent metal oxide. Specifically, the compensation layer 470 is made of one or more of ITO, IZO, MoOx and AZO. For descriptions of the compensation layer 470, reference may be made to the corresponding descriptions of the forming method in the first embodiment described above, and details thereof will not be further described herein.

Specifically, the second planarization treatment is used for removing the compensation material layer higher than the top of the isolation layer 460, that is, the top of the formed compensation layer 470 is flush with the top of the isolation layer 460.

The top of the compensation layer 470 is a flat surface, that is, the top of the compensation layer 470 in the first pixel area I, the top of the compensation layer 470 in the second pixel area II, and the top of the compensation layer 470 in the third pixel area III are flush. Since there are height differences among the top of the anode layer in the first pixel area I, the top of the anode layer in the second pixel area II, and the top of the anode layer in the third pixel area III, the compensation layer 470 with different thicknesses is formed on the anode layer in the first pixel area I, the anode layer in the second pixel area II, and the anode layer in the third pixel area III. In this way, the cavity length of the first pixel area I, the cavity length of the second pixel area II, and the cavity length of the third pixel area III can be individually modulated.

Correspondingly, the present disclosure further provides a pixel structure.

FIG. 34 shows a schematic diagram of a structure of a pixel structure according to the third embodiment of the present disclosure.

The pixel structure in this embodiment that is the same as the pixel structure in the first embodiment will not be further described herein. The pixel structure of this embodiment differs from the pixel structure of the first embodiment in that the anode layer (not labeled) has different thicknesses respectively in the first pixel area I, the second pixel area II, and the third pixel area III.

For descriptions of the substrate 400, reference may be made to the corresponding descriptions of the forming method in the first embodiment described above. An interconnection metal layer 410 and a conductive plug 420 electrically connected to the interconnection metal layer 410 are formed in the substrate 400, and the substrate 400 exposes the conductive plug 420.

In this embodiment, the pixel structure further includes: a first anode material layer (not labeled) located on the substrate 400 in the second pixel area II and third pixel area III; a second anode material layer (not labeled) located on the first anode material layer in the third pixel area III; and a third anode material layer (not labeled) located on the substrate 400 in the first pixel area I, on the first anode material layer in the second pixel area II, and on the second anode material layer in the third pixel area III.

The third anode material layer in the first pixel area I constitutes the anode layer in the first pixel area I. The third anode material layer and the first anode material layer in the second pixel area II constitute the anode layer in the second pixel area II. The third anode material layer, the second anode material layer, and the first anode material layer in the third pixel area III constitute the anode layer in the third pixel area III.

In this embodiment, the pixel structure further includes an isolation layer 460 having an opening (not labeled) exposing the anode layer in the first pixel area I, the second pixel area II, and the third pixel area III. Correspondingly, the compensation layer 470 is located in the opening.

Therefore, by having height differences among the top surface of the anode layer in the first pixel area I, the top surface of the anode layer in the second pixel area II and the top surface of the anode layer in the third pixel area III, the opening in the isolation layer 470 has different depths respectively in the first pixel area I, the second pixel area II, and the third pixel area III. Correspondingly, the compensation layer 470 on the anode has different thicknesses respectively in the first pixel area I, the second pixel area II and the third pixel area III. In this way, the cavity length of the first pixel area I, the cavity length of the second pixel area II, and the cavity of the third pixel area III can be individually modulated.

It should be noted that in order to reduce the process difficulty of forming the opening, the isolation layer 460 further covers parts of the anode layer in the first pixel area I, the second pixel area II, and the third pixel area III, that is, the opening exposes parts of the anode layer. Correspondingly, the compensation layer 470 in the first pixel area I is located on a part of the anode layer in the first pixel area I, the compensation layer 470 in the second pixel area II is located on a part of the anode layer in the second pixel area II, and the compensation layer 470 in the third pixel area III is located on a part of the anode layer in the third pixel area III.

In a case where the thickness of the first anode material layer can meet the requirements of the green light pixels, the thickness of the second anode material layer can meet the requirements of the blue light pixels and the thickness of the third anode material layer can meet the requirements of the red light pixels, the thicknesses of the first anode material layer, the thickness of the second anode material layer, and the thickness of the third anode material layer are reasonably set. In this embodiment, the thickness of the first anode material layer is within a range of 300 Å to 700 Å, the thickness of the second anode material layer is within a range of 300 Å to 700 Å, and the thickness of the third anode material layer is within a range of 100 Å to 500 Å.

In a case where the thickness of the first anode material layer, the thickness of the second anode material layer, and the thickness of the third anode material layer are constant, the thickness of the compensation layer 470 depends on the thickness of the isolation layer 460. To this end, in this embodiment, the thickness of the isolation layer 460 is within a range of 1000 Å to 2000 Å according to actual process requirements.

It should be further noted that the anode layer in the first pixel area I, the anode layer in the second pixel area II, and the anode layer in the third pixel area III are separated from one another, and an isolation opening (not labeled) exposing the substrate 400 is formed between adjacent anode layers.

In this embodiment, the isolation layer 460 is further located in the isolation opening, and the isolation layer 170 is configured to isolate adjacent pixels from one another.

For detailed descriptions of the isolation layer 460, reference may be made to the corresponding descriptions in the fourth embodiment described above, and details thereof will not be further described herein.

In this embodiment, the first anode material layer includes a first reflective metal layer 430 and a first transparent conductive layer 435 located on the first reflective metal layer 430. In other embodiments, the first anode material layer may include only the first reflective metal layer.

In this embodiment, the second anode material layer includes a second reflective metal layer 440 and a second transparent conductive layer 445 located on the second reflective metal layer 440. In other embodiments, the first anode material layer may include only the first reflective metal layer.

In this embodiment, the third anode material layer includes a third reflective metal layer 450 and a third transparent conductive layer 455 located on the third reflective metal layer 450. In other embodiments, the third anode material layer may include only the third reflective metal layer.

By using the first reflective metal layer 430 and the first transparent conductive layer 435 as the first anode material layer with a stacked-layer structure, using the second reflective metal layer 440 and the second transparent conductive layer 445 as the second anode material layer with a stacked-layer structure, and using the third reflective metal layer 450 and the third transparent conductive layer 455 as the third anode material layer with a stacked-layer structure, the first transparent conductive layer 435, the second transparent conductive layer 445 and the third transparent conductive layer 455 respectively protect the first reflective metal layer 430, the second reflective metal layer 440, and the third reflective metal layer 450.

For detailed descriptions of the anode layer, reference may be made to the corresponding descriptions in the fourth embodiment described above, and details thereof will not be further described herein.

In addition, the present disclosure further provides a display screen, which includes a number of pixel structures according to the third embodiment of the present disclosure.

The compensation layer has different thicknesses respectively in the first pixel area I, the second pixel area II, and the third pixel area III, thereby improving the brightness and color gamut of the display screen.

Although the present disclosure has been disclosed above, the present disclosure is not limited thereto. Any changes and modifications may be made by those skilled in the art without departing from the spirit and scope of the present disclosure, and the scope of the present disclosure shall be defined by the appended claims.

What is claimed is:

1. A method for forming a pixel structure, comprising:
   providing a substrate for forming an OLED device, wherein the substrate has a first pixel area, a second pixel area, and a third pixel area;
   forming an anode layer on the substrate;
   forming a first compensation material layer, a second compensation material layer, and a third compensation material layer on a part of the anode layer in the first pixel area;
   forming the first compensation material layer and the second compensation material layer on a part of the anode layer in the second pixel area; and
   forming the first compensation material layer on a part of the anode layer in the third pixel area,
   wherein the first compensation material layer, the second compensation material layer, and the third compensation material layer in the first pixel area constitute a part of a compensation layer in the first pixel area; the first compensation material layer and the second compensation material layer in the second pixel area constitute a part of the compensation layer in the second pixel area; and the first compensation material layer in the third pixel area constitutes a part of the compensation layer in the third pixel area;
   wherein forming the first compensation material layer, the second compensation material layer, and the third compensation material layer comprises:
   forming the first compensation material layer on the anode layer,
   forming the second compensation material layer on the first compensation material layer,
   removing the second compensation material layer in the third pixel area,
   forming the third compensation material layer on the second compensation material layer in the first pixel area and the second pixel area, and on the first compensation material layer in the third pixel area, and
   removing the third compensation material layer in the second pixel area and the third pixel area; and
   wherein said forming the second compensation material layer comprises:

forming a first sacrifice layer on the first compensation material layer in the third pixel area; and forming the second compensation material layer covering the first compensation material layer in the first pixel area, the second pixel area, and the first sacrifice layer.

2. The method for forming a pixel structure according to claim 1, wherein the first pixel area is a red light pixel area, the second pixel area is a green light pixel area, and the third pixel area is a blue light pixel area.

3. The method for forming a pixel structure according to claim 1, wherein said forming the third compensation material layer comprises:

forming a second sacrifice layer on the second compensation material layer in the second pixel area and on the first compensation material layer in the third pixel area; and forming the third compensation material layer covering the second compensation material layer in the first pixel area, and the second sacrifice layer.

4. The method for forming a pixel structure according to claim 1, wherein in said removing the second compensation material layer in the third pixel area, the second compensation material layer, the first compensation material layer and the anode layer at a junction of the second pixel area and the third pixel area are further removed, and a first isolation opening exposing the substrate is formed at the junction of the second pixel area and the third pixel area;

in said removing the third compensation material layer in the second pixel area and the third pixel area, the third compensation material layer, the second compensation material layer, the first compensation material layer, and the anode layer at a junction of the first pixel area and the second pixel area are further removed, and a second isolation opening exposing the substrate is formed at the junction of the first pixel area and the second pixel area.

5. The method for forming a pixel structure according to claim 4, further comprising, after the compensation layer is formed: forming an isolation layer filled up in the first isolation opening and the second isolation opening.

6. The method for forming a pixel structure according to claim 5, wherein said forming the isolation layer comprises:

filling up the first isolation opening and the second isolation opening with an isolation membrane, the isolation membrane further covering a top of the compensation layer; and etching the isolation membrane by a no-mask process to remove the isolation membrane on the top of the compensation layer while remaining a part of the isolation membrane in the first isolation opening and the second isolation opening as the isolation layer.

7. The method for forming a pixel structure according to claim 5, wherein said forming the isolation layer comprises:

filling up the first isolation opening and the second isolation opening with an isolation membrane, the isolation membrane further covering a top of the compensation layer;

forming a pattern layer on the isolation membrane in an area corresponding to the first isolation opening and the second isolation opening;

etching the isolation membrane by using the pattern layer as a mask, wherein a remaining part of the isolation membrane serves as the isolation layer; and removing the pattern layer.

8. The method for forming a pixel structure according to claim 1, wherein the part of the anode layer in the first pixel area, the part of the anode layer in the second pixel area and the part of the anode layer in the third pixel area have different thicknesses.

9. The method for forming a pixel structure according to claim 8, wherein said forming the compensation layer on the substrate comprises:

forming an isolation membrane covering the anode layer;

performing a first planarization treatment on the isolation membrane, wherein a remaining part of the isolation membrane serves as an isolation layer;

etching the isolation layer to form an opening exposing the anode layer in the isolation layer in the first pixel area, the second pixel area, and the third pixel area;

filling up the opening with a compensation material layer; and performing a second planarization treatment on the compensation material layer, wherein a remaining part of the compensation material layer serves as the compensation layer.

10. The method for forming a pixel structure according to claim 9, wherein the part of the anode layer in the first pixel area, the part of the anode layer in the second pixel area, and the part of the anode layer in the third pixel area are separated from one another, and an isolation opening exposing the substrate is formed between adjacent parts of the anode layer; and the isolation layer is also filled in the isolation opening.

11. The method for forming a pixel structure according to claim 9, wherein said forming the anode layer comprises:

forming a first anode material layer on the substrate;

removing the first anode material layer in the first pixel area to expose the substrate in the first pixel area;

forming a second anode material layer on the substrate in the first pixel area and on the first anode material layer;

removing the second anode material layer in the first pixel area and the second pixel area to expose the substrate in the first pixel area and the first anode material layer in the second pixel area; and forming a third anode material layer on the substrate in the first pixel area, on the first anode material layer in the second pixel area, and on the second anode material layer in the third pixel area, wherein the third anode material layer in the first pixel area constitutes the part of anode layer in the first pixel area; the third anode material layer and the first anode material layer in the second pixel area constitute the part of the anode layer in the second pixel area; and the third anode material layer, the second anode material layer and the first anode material layer in the third pixel area constitute the part of the anode layer in the third pixel area.

12. A method for forming a pixel structure, comprising:

providing a substrate for forming an OLED device, wherein the substrate has a first pixel area, a second pixel area, and a third pixel area;

forming an anode layer on the substrate;

forming a first compensation material layer, a second compensation material layer, and a third compensation material layer on a part of the anode layer in the first pixel area;

forming the first compensation material layer and the second compensation material layer on a part of the anode layer in the second pixel area; and forming the first compensation material layer on a part of the anode layer in the third pixel area, wherein the first compensation material layer, the second compensation material layer, and the third compensation material layer in the first pixel area constitute a part of a compensation layer in the first pixel area; the first compensation material layer and the second compensation material layer in the second pixel area constitute a part of the compensation layer in the second pixel area; and the first compensation material layer in the third pixel area constitutes a part of the compensation layer in the third pixel area; and wherein forming the first compensation material layer, the second compensation material layer, and the third compensation material layer comprises:

forming the first compensation material layer on the anode layer;

forming the second compensation material layer on the first compensation material layer;

forming the third compensation material layer on the second compensation material layer, wherein the third compensation material layer is formed on a part of the second material that is formed in the third pixel area;

removing the third compensation material layer in the third pixel area and the second compensation material layer in the third pixel area; and removing the third compensation material layer in the second pixel area, wherein the first compensation material layer, the second compensation material layer, and the third compensation material layer in the first pixel area constitute the part of the compensation layer in the first pixel area; the first compensation material layer and the second compensation material layer in the second pixel area constitute the part of the compensation layer in the second pixel area; and the first compensation material layer in the third pixel area constitutes the part of the compensation layer in the third pixel area.

13. The method for forming a pixel structure according to claim 12, wherein said forming the second compensation material layer comprises:

forming a first sacrifice layer on the first compensation material layer in the third pixel area; and forming the second compensation material layer covering the first compensation material layer in the first pixel area and the second pixel area, and the first sacrifice layer.

14. The method for forming a pixel structure according to claim 12, wherein said forming the third compensation material layer comprises:

forming a second sacrifice layer on the second compensation material layer in the second pixel area; and forming the third compensation material layer covering the first compensation area layer in the first pixel area and the third pixel area, and the second sacrifice layer.

15. The method for forming a pixel structure according to claim 12, wherein in said removing the third compensation material layer in the third pixel area and the second compensation material layer in the third pixel area, the third compensation material layer, the second compensation material, the first compensation material layer and the anode layer at a junction of the second pixel area and the third pixel area are further removed, and a first isolation opening exposing the substrate is formed at the junction of the second pixel area and the third pixel area; and in said removing the third compensation material layer in the second pixel area, the third compensation material layer, the second compensation material layer, the first compensation material layer and the anode layer at a junction of the first pixel area and the second pixel area are further removed, and a second isolation opening exposing the substrate is formed at the junction of the first pixel area and the second pixel area.

16. The method for forming a pixel structure according to claim 15, further comprising, after the compensation layer is formed: forming an isolation layer filled up in the first isolation opening and the second isolation opening.

17. The method for forming a pixel structure according to claim 16, wherein said forming the isolation layer comprises:

filling up the first isolation opening and the second isolation opening with an isolation membrane, the isolation membrane further covering a top of the compensation layer; and etching the isolation membrane by a no-mask process to remove the isolation membrane on the top of the compensation layer while remaining a part of the isolation membrane in the first isolation opening and the second isolation opening as the isolation layer.

18. The method for forming a pixel structure according to claim 16, wherein said forming the isolation layer comprises:

filling up the first isolation opening and the second isolation opening with an isolation membrane, the isolation membrane further covering a top of the compensation layer;

forming a pattern layer on the isolation membrane in an area corresponding to the first isolation opening and the second isolation opening;

etching the isolation membrane by using the pattern layer as a mask, wherein a remaining part of the isolation membrane serves as the isolation layer; and removing the pattern layer.

* * * * *